US006552960B2

(12) United States Patent
Shirai et al.

(10) Patent No.: US 6,552,960 B2
(45) Date of Patent: Apr. 22, 2003

(54) SEMICONDUCTOR INTEGRATED CIRCUIT DEVICE

(75) Inventors: Yutaka Shirai, Yokohama (JP); Daisuke Kato, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/163,081

(22) Filed: Jun. 4, 2002

(65) Prior Publication Data
US 2002/0179943 A1 Dec. 5, 2002

(30) Foreign Application Priority Data

Jun. 4, 2001 (JP) ........................................ 2001-168705

(51) Int. Cl.$^7$ .............................. G11C 8/00; G11C 7/00
(52) U.S. Cl. .................. 365/233; 365/189.05; 365/200; 365/225.7
(58) Field of Search ................................. 365/233, 200, 365/189.05, 203, 225.7, 195

(56) References Cited
U.S. PATENT DOCUMENTS 5,208,776 A    5/1993 Nasu et al.
5,841,711 A  * 11/1998 Watanabe .................... 365/200
5,978,291 A  * 11/1999 Kirihata ...................... 365/200
6,144,592 A  * 11/2000 Kanda ......................... 365/200
6,262,926 B1 *  7/2001 Nakai .......................... 365/200

* cited by examiner

*Primary Examiner*—Son T. Dinh
*Assistant Examiner*—Nam T. Nguyen
(74) *Attorney, Agent, or Firm*—Hogan & Hartson, LLP

(57) ABSTRACT

A semiconductor integrated circuit includes a plurality of functional circuits, a plurality of signal transmission lines disposed to interconnect among the functional circuits for transfer of a plurality of control signals which are to be supplied to respective functional circuits and are different in timing from one another, and a control circuit for generation of the control signals. The control circuit has a plurality of stages of control signal generator circuits that generate and issue the control signals respectively. The control signal generator circuits are specifically linked together so that when one generator circuit at a certain stage generates at its output a control signal to be transferred over a corresponding signal line, another circuit at the next stage is activated in response to receipt of this control signal.

13 Claims, 17 Drawing Sheets

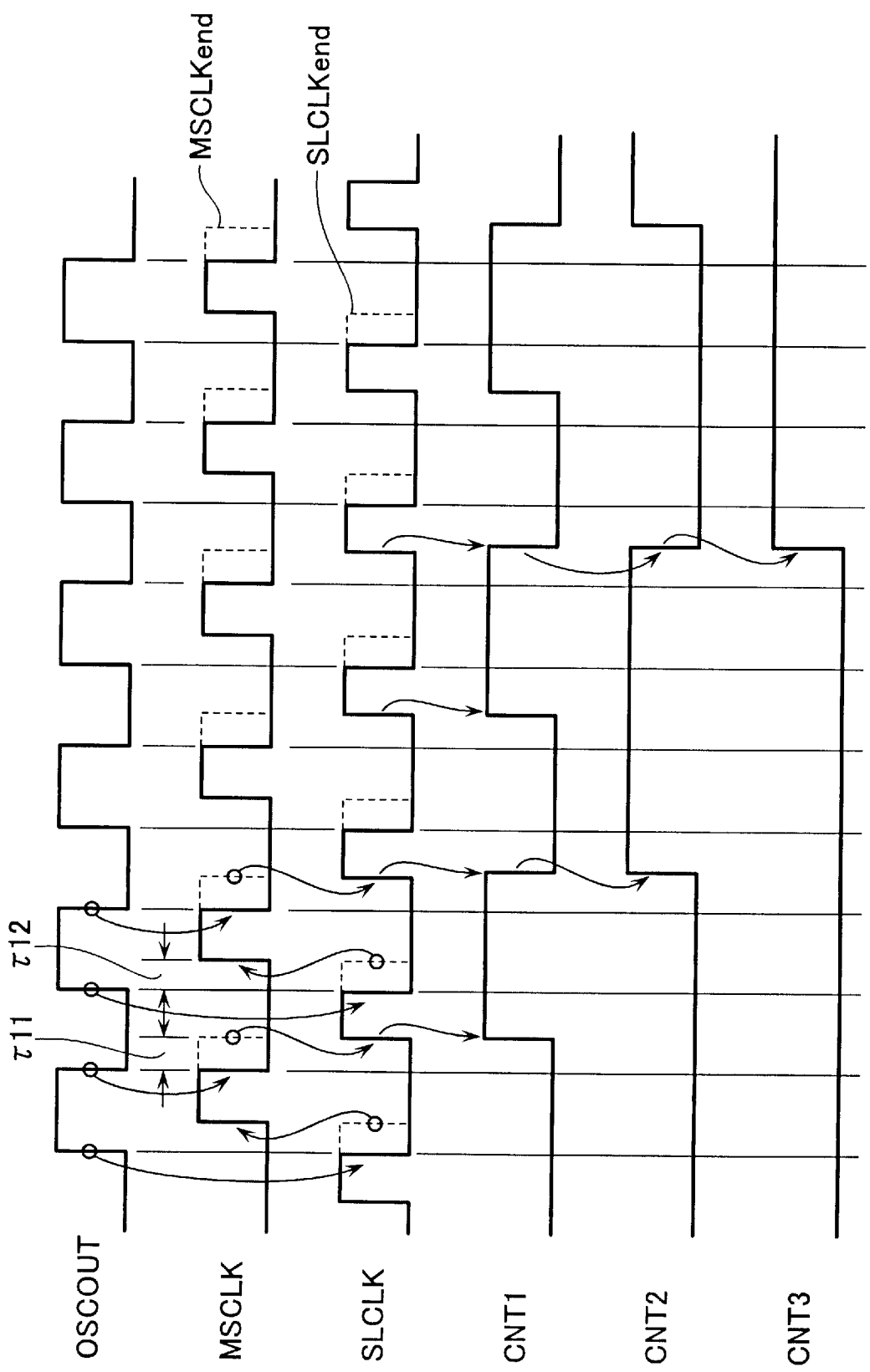

SEMICONDUCTOR INTEGRATED CIRCUIT DEVICE

CROSS-REFERENCE TO RELATED APPLICATION

This application is based on and claims the benefit of priority from prior Japanese Patent Application No. 2001-168705, filed on Jun. 4, 2001, the entire content of which is incorporated herein by reference.

BACKGROUND OF THE INVENTION

1. Field of the Invention

This invention relates generally to semiconductor integrated circuit architectures and more particularly to semiconductor integrated circuitry with a plurality of functional circuits controllable by multiple control signals respectively.

2. Description of the Related Art

Various types of currently available semiconductor memory devices such as dynamic random access memory (DRAM) chips are customarily designed to employ redundancy circuit schemes for defect cell repair or "rescue" purposes. In redundancy circuit-embedded memory chips, there are prepared a redundant row cell array and a redundant column cell array in addition to a normal cell array. And, upon inputting of the address of a defective or "fault" cell, control is performed to replace a defective row with a redundant row or replace a defective column by a redundant column. To achieve such replacement controllability, memory chips come with built-in defect address storage circuitry including but not limited to more than one fuse circuit. The defect address storage circuitry offers an ability to write or "programs" one or more defect addresses based on test results of the memory chip of interest.

A typical configuration of certain part of such prior known semiconductor memories is shown in FIG. 16, which part has fuse information latching functionality. The circuit shown herein includes a plurality of fuse latch circuits 11, each of which is operable to automatically read fuse data as has been programmed after power-up and then latch it therein. Thereafter, the latch data will be used to perform An address replacement control operation(s). In order to detect a powerup event and automatically initialize the fuse latch circuits 11, there are provided a power-on circuit 10 and a fuse latch initialize circuit (initializer) 13 operatively responsive to receipt of an output of it for performing initialization of fuse latch circuits 11.

The fuse latch initialize circuit 13 receives a power-on signal PWRON as input thereto from the power-on circuit 10 and then generates based on this signal both a precharge signal BFPRCH which is used to uniformly precharge the fuse latch circuits 11 and a fuse set signal FSET for setting up fuse information at the fuse latch(es). The precharge signal bFPRCH and fuse set signal FSET are input to each fuse latch circuit 11, which then outputs fuse information initialized by these signals toward an output end FBLWN.

A configuration of one fuse latch circuit 11 is shown in FIG. 17 whereas an arrangement of the fuse latch initialize circuit 13 is illustrated in FIG. 18. A configuration of the power-on circuit 10 is depicted in FIG. 19. As shown in FIG. 19, the power-on circuit 10 operates so that when a power supply voltage Vcc reaches a prespecified potential level after power-up, an inverter INV31 inverts, to which an intermediate or "midway" voltage as generated by potential division of resistors R1 and R2 is input. In responding to receipt of an output of this inverter INV31, respective ones of serially connected inverters INV32, INV33 and INV34 will further be inverted sequentially, causing an output signal PWRON to finally change in potential from "Low" or "L" level to "High" ("H") level.

As shown in FIG. 18, in the fuse latch initialize circuit 13, a level transition detection circuit 61 that consists of inverters INV11 to INV13 and a NAND gate G1 detects a level transition of the power-on signal PWRON from "L" to "H" level, resulting output of a precharge signal bFPRCH which is a negative logic pulse(s). In addition, a delay circuit 62 and a level transition detector circuit 63 for detection of an "L"-to-"H" level transition of an output thereof permit output of a fuse set signal FSET with a time lag or delay from the issuance of the precharge signal bFPRCH. The level transition detector circuit 63 has inverters INV21–23 and a NAND gate G2 in a similar manner to that of the level transition detector circuit 61, with a further inverter INV24 provided at its output, resulting in the fuse set signal FSET becoming a positive logic pulse(s). The precharge signal bFPRCH and fuse set signal FSET are adjustable in timing by the delay circuit 62.

As shown in FIG. 17 the fuse latch circuit 11 is configured from a fuse element F that is programmable by laser irradiation and a latch 111. The laser-programmable fuse F is such that programming is done based on wafer test results in such a way as to cut off a portion corresponding to a defect address. Upon power-up, a P-channel metal oxide semiconductor (PMOS) transistor QP turns on in response to receipt of a precharge signal bFPRCH, causing "H" level of supply voltage Vcc to be precharged at a node A. Thereafter, upon supplement of a fuse set signal FSET, the node A is discharged through an N-channel MOS (NMOS) transistor QN and the fuse F in case fuse F is not yet cut off; if fuse F is cut then it retains "H" level. To be brief, the fuse information indicative of whether the fuse is already cut or not yet cut—namely, electrically open-circuit or short-circuit—is read and held at the latch 111 while letting a finally obtainable output signal FBLWN be set at "L" if fuse F remains conductive or alternatively set at "H" if fuse F is cut and made nonconductive.

To enable the fuse latch circuit 11 to perform this operation, the precharge signal bFPRCH as output from the fuse latch initialize circuit 13 is specifically designed so that its negative pulse width has a length of time period long enough to permit the node A to be fully precharged whereas the fuse set signal FSET is such that its positive pulse width is set at a time long sufficient to allow node A to discharge.

Turning to FIG. 20, there is shown an operation timing chart covering from supply voltage rise-up to setup of the fuse information. A delay time X shown herein of from a timing at which the precharge signal bFPRCH transitions to "L" level up to a timing whereat the fuse set signal FSET potentially shifts to "H" level is the delay time that is set by the delay circuit 62 within the above-discussed fuse latch initialize circuit 13. In order to enable the fuse latch circuit 11 to properly read its contained fuse information and then latch it therein, it is inevitable to avoid any situation in which both the PMOS transistor QP and the NMOS transistor QN turn on at a time. Accordingly, the delay time T must be set at specific values greater than the pulse width of precharge signal bFPRCH.

Assume here that the delay time τ is less than the pulse width of the precharge signal bFPRCH for explanation purposes only. In this case, in a fuse latch circuit 11 with its fuse being not cut yet, the node A begins discharging due to the NMOS transistor QN at a time point during precharging due to the PMOS transistor QP, resulting in collision or impingement of such discharge and charge-up events. Consequently, it will no longer be able to accurately determine whether the node A potentially drops down at on-chip ground or "source" level Vss while the fuse set signal FSET is kept at "H" level, i.e. within a turn-on time period of NMOS transistor QN, which would lead to the lack of any reliable establishment of the latch state in a way as expected. For the very reason, it should be strictly required that the delay time τ be set in value at the negative pulse width of precharge signal bFPRCH with a sufficiently significant margin added thereto.

However, even if a long enough delay time τ is secured in the fuse latch initialize circuit 13 for use as the source for generation of the precharge signal bFPRCH and fuse set signal FSET, there is no guarantee that such delay time τ still remains in cases where the precharge signal bFPRCH and fuse set signal FSET are transferred over long signal lines. The reason of this will be explained in detail below.

Typically a great number of fuse latch circuits 11 are provided as shown in FIG. 16 so that the resulting gate capacitance that acts as the load of the signal lines 12 for transmission of the precharge signal bFPRCH and fuse set signal FSET would likewise increase in value. The fuse latch circuits 11 are not always laid out collectively at a single limited location within a memory chip: in many cases, these circuits are distributed at several spaced-apart layout locations. This distributed layout does not come without accompanying a penalty that on-chip lead wiring or "railing" becomes complicated, resulting in parasitic capacitance and resistance components of signal lines 12 being hardly negligible. Especially in case the precharge signal bFPRCH and fuse set signal FSET are appreciably different from each other in values of parasitic capacitance/resistance components of signal lines 12, fuse latch circuits 11 associated with the signal lines 12 at locations relatively far from the fuse latch initialize circuit 13 become deficient in delay time τ, which can result in erroneous latch of fuse information therein.

Accordingly, in order to preclude improper operations or malfunctions of the fuse latch circuits 11, it is also required to design an appropriate layout pattern to ensure that the fuse set signal FSET is made greater in signal transmission delay than the precharge signal bFPRCH while having accurately estimated the values of resistance and capacitance components as added to respective signal lines 12 of the precharge signal bFPRCH and fuse set signal FSET. Unfortunately this must call for troublesome and time-consuming works in a practical standpoint. After all, an effective approach to precluding operation failures is to set up at the stage of circuit design the delay time τ within the fuse latch initialize circuit 13 so that it has a sufficiently large value. However, it is difficult to say that this approach is almighty.

The above problems are not unique to the fuse latch circuits. Like problems can occur in cases where multiple programmable control data storage circuits similar in function to the above-stated fuse latch circuits are integrated together on an integrated circuit (IC) chip for performing operation control of the IC chip after having initialized these circuits. More generically, similar problems occur in IC chips with a plurality of functional circuits controllable by multiple control signals each having a prespecified timing difference.

SUMMARY OF THE INVENTION

A semiconductor integrated circuit in accordance with one aspect of this invention comprises a plurality of functional circuits, a plurality of signal lines associated with these functional circuits for transfer of a plurality of control signals different in timing from one another to be supplied to each functional circuit, and a control circuit for generation of the control signals. The control circuit includes a plurality of stages of control signal generation circuits for generating the control signals respectively. The control signal generation circuits are specifically linked together in such a manner that when a control signal generation circuit at a certain stage outputs a control signal to be transferred over a corresponding signal line, another control signal generation circuit at the next stage is made active or activated in response to this control signal.

These and other features and advantages of the invention will be apparent from the following more particular description of preferred embodiments of the invention, as illustrated in the accompanying drawings.

BRIEF DESCRIPTION OF THE DRAWINGS

FIG. 26 is an operation timing diagram of the binary counter of FIGS. 21–22.

DETAILED DESCRIPTION OF THE EMBODIMENTS

Figure 1:
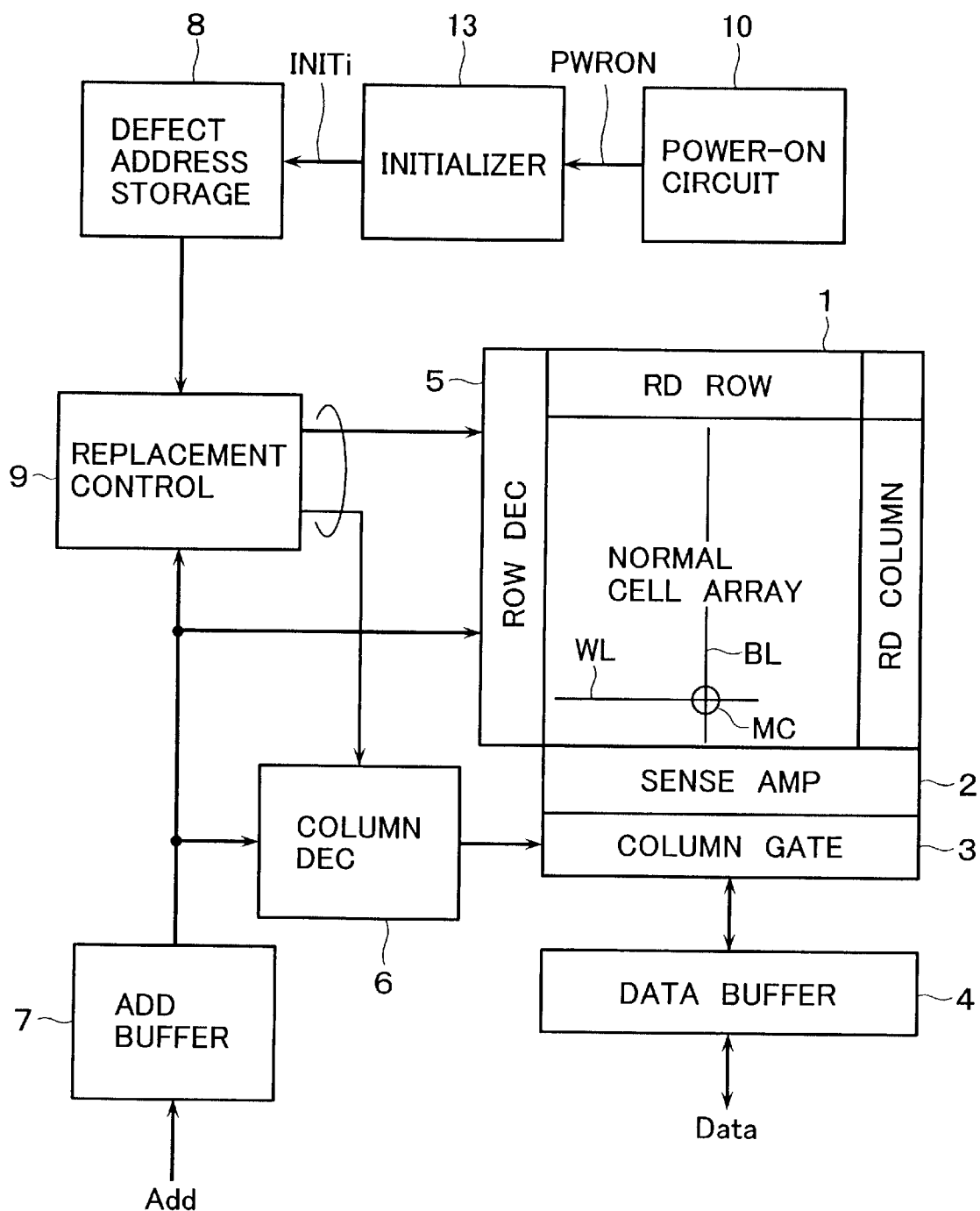
FIG. 1 is a diagram showing a configuration of main part of a semiconductor memory device in accordance with an embodiment of this invention.

Several embodiments of this invention will be described with reference to the accompanying drawings below. Like parts and parts performing similar functions are designated by like reference characters.

Reference is initially made to FIG. 1, which illustrates in schematic block form a repairable semiconductor integrated circuit memory device of the type employing redundancy circuit architecture or scheme in accordance with an embodiment of this invention. As shown herein, this redundancy circuit-embedded memory includes an array of rows and columns of memory cells, denoted by reference numeral 1. This memory cell array 1 has a normal cell array and also has a redundant row cell array which includes a plurality of spare word lines and a redundant column cell array with multiple spare column select lines.

Selection of word lines WL of the memory cell array 1 is performed by a row decoder 5 whereas bit-line selection is done by a column decoder 6 and a column gate 3. Bit lines BL are associated with a sense amplifier 2 connected thereto. Read data of a bit line BL as selected by the column gate 3 is output via a data buffer 4 to an input/output (I/O) terminal. Write data supplied from an I/O terminal is transferred via the data buffer 4 to a bitline(s). Address signals Add are fetched or "imported" via an address buffer 7 so that row and column addresses are decoded by the row decoder 5 and column decoder 6 respectively.

In order to perform control for replacement of a defective cell or cells in the memory cell array 1 by the redundant row cell array and redundant column cell array, there are provided a defect address storage circuit 8 into which the address of a defective or "fault" cell, known as a defect address, is programmed based on a test result and a replacement control circuit 9 operable to detect whether an externally supplied address is identical to the defect address being presently held at the defect address storage circuit 8 and then output a replacement command signal. This replacement signal is for inactivating a corresponding decoder unit(s) within the row decoder 5 and/or column decoder 6 while activating a spare decoder unit(s) for selection of the redundant row cell array and/or redundant column cell array.

The defect address storage circuit 8 is equipped with a fuse latch circuit as will be described later in the description and calls for an initialize operation for automatically reading programmed data after power-up. To do this, a power-on circuit 10 and an initialize circuit 13 are provided. Upon powerup, in response to receipt of a power-on signal PWRON as output from the power-on circuit 10, the initialize circuit 13 generates and issues a plurality of initialize signals FINITi which are different in timing from one another. These initialize signals FINITi are used to perform initialization (an operation for reading and retaining programmed data) of the defect address storage circuit 8.

Figure 2:
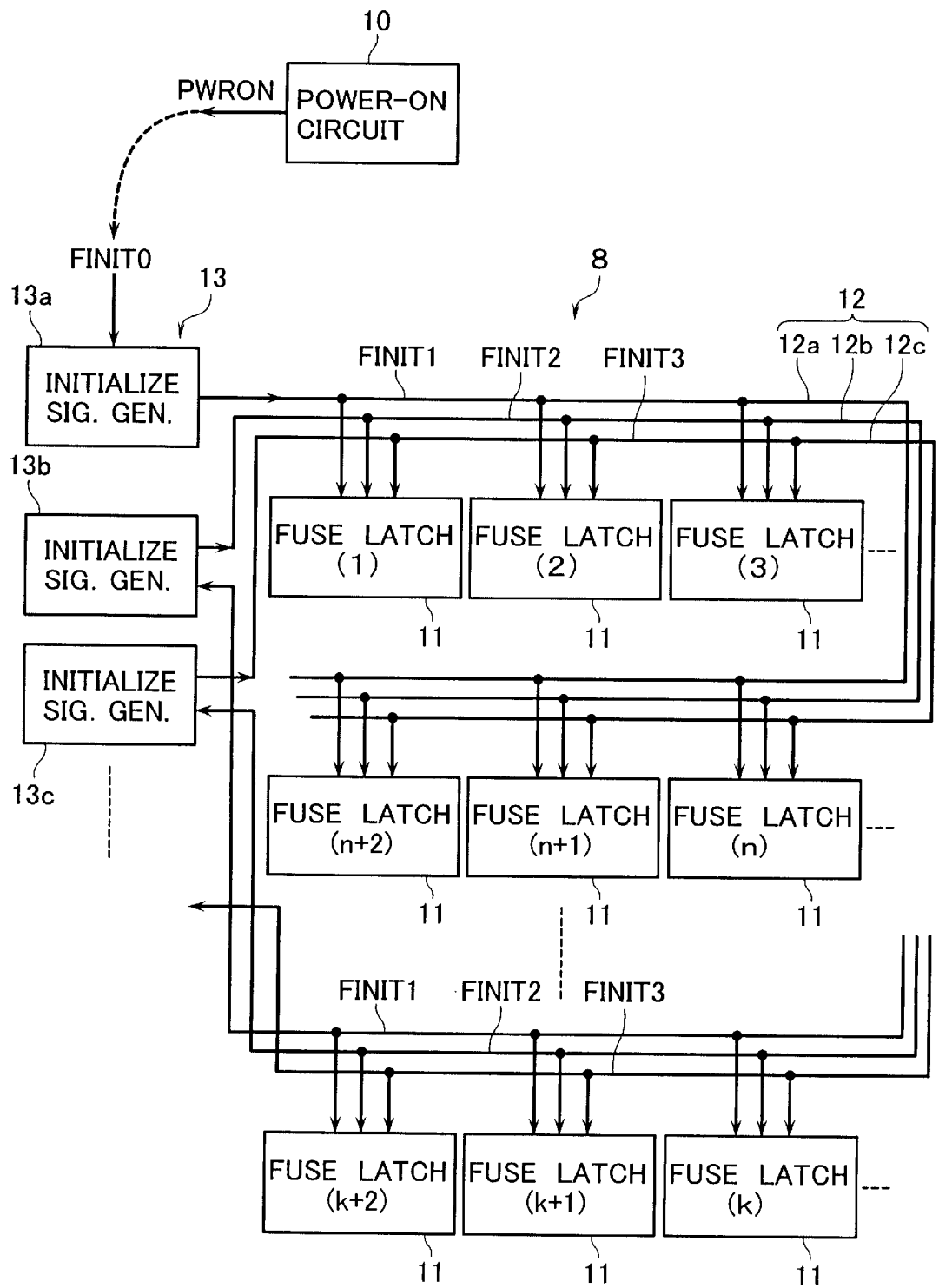
FIG. 2 is a diagram showing a configuration of circuitry including a defect address storage circuit and an initialize circuit of the embodiment memory device.

Turning to FIG. 2, there is depicted a practically implemented configuration of the defect address storage circuit 8. As shown, the defect address storage circuit 8 is configured from a plurality of fuse latch circuits 11. Initialization of each fuse latch circuit 11 requires the use of multiple initialize signals FINITi (FINIT1, FINIT2, . . . ) adjacent ones of which are slightly deviated or offset in timing from each other; thus, the initialize circuit 13 is made up of a plurality of stages of initialize signal generator circuits 13*a*, 13*b*, 13*c*, . . . for sequentially outputting these initialize signals FINITi.

An initial stage of initialize signal generator circuit 13*a* is operatively responsive to receipt of a start-up signal FINIT0 as input thereto for generating at its output a first initialize signal FINIT1. In the illustrative embodiment, the startup signal FINIT0 may be an output signal PWRON of the power-on circuit 10. The initialize signal FINIT1 is transferred over a single signal transmission line 12*a* of a signal line bundle 12 and then supplied to multiple fuse latch circuits 11. Whereby, a first initialize operation is done at each fuse latch circuit 11. The signal line 12*a* is connected at its terminate end to an activation input terminal of a second-stage initialize signal generator circuit 13*b*. Accordingly, the second-stage initialize signal generator circuit 13*b* is made active or activated in response to receipt of the first initialize signal FINIT1 as obtained at the terminate end of the signal line 12*a* to thereby output a second initialize signal FINIT2. The second initialize signal FINIT2 is sent forth via a signal line 12*b* of the signal line bundle 12 and then supplied to each fuse latch circuit 11 in a similar way to that of the first initialize signal FINIT1. Whereby a subsequent initialize operation is done at each fuse latch circuit 11. The second initialize signal FINIT2 is input from a terminate end of the signal line 12*b* to a third-stage initialize signal generator circuit 13*c* as an activation signal thereof. The remaining ones of the initialize signal generator circuits 13*c* et sequentia will operate in a similar way. In brief, the plural stages of initialize signal generator circuits 13*a*, 13*b*, . . . are specifically linked together in such a manner that after supplement of an output signal of n-th circuit to each fuse latch circuit 11 via a transfer route or path, this signal is input as an activation signal to the (n+1)th circuit from a terminate end of the transfer path.

As previously stated, an initialize operation based on several initialize signals with a fixed or constant timing difference between adjacent ones of them is required for achievement of readout and retaining of fuse data of each fuse latch circuit 11. In the illustrative embodiment after the first initialize signal FINIT1 has supplied to all the fuse latch circuits 11 involved, the second initialize signal FINIT2 is generated; after this signal has fed to all the fuse latch circuits 11, the third initialize signal FINIT3 is generated. Consequently, the order of sequence of the expected initialize operations will be kept unchanged even at any one of the fuse latch circuits 11 to thereby ensure that the initialize signals are supplied thereto at a constant order, which in turn makes it possible to properly set up correct fuse information at any events.

Figure 3:
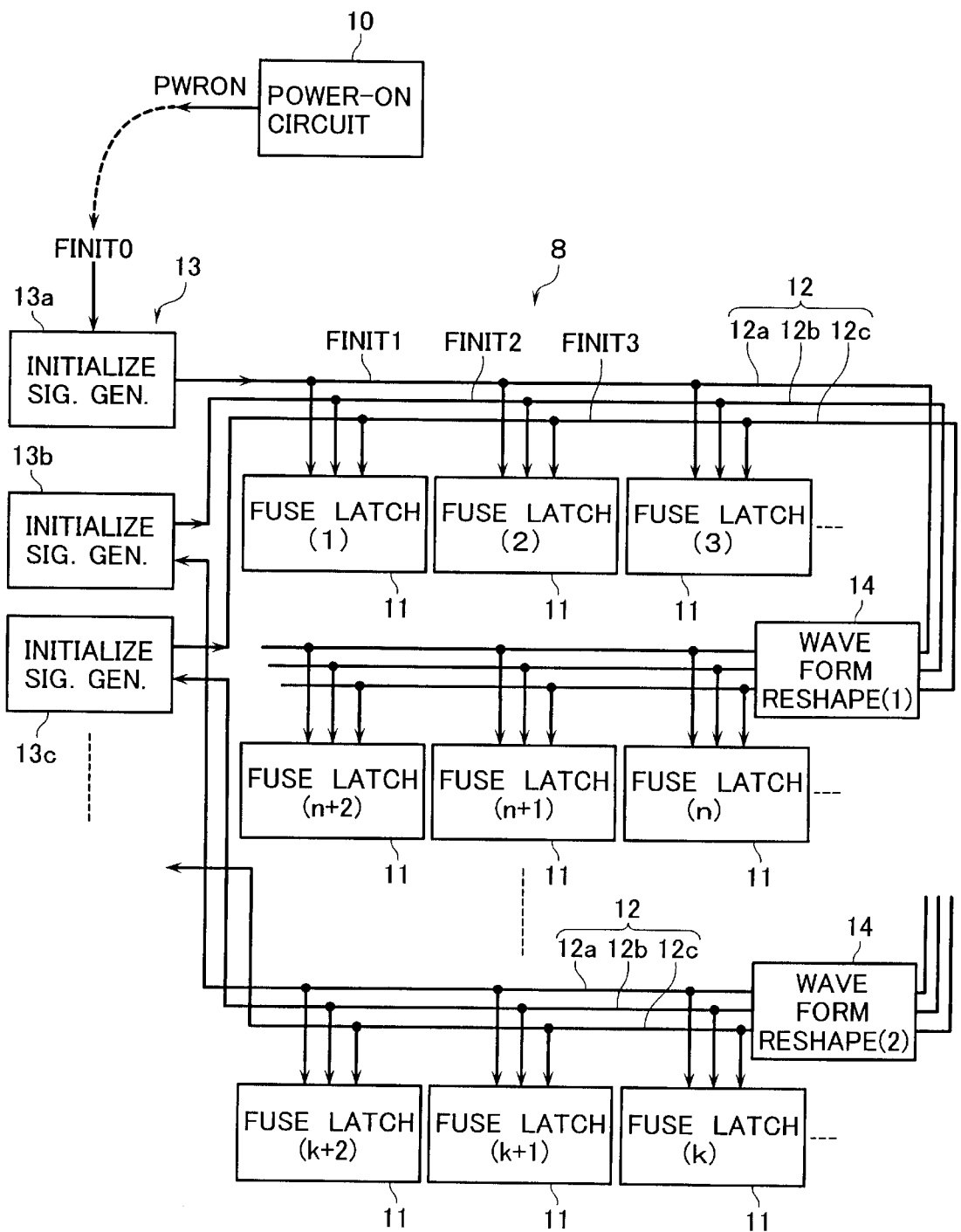
FIG. 3 is a diagram showing a configuration of circuitry including a defect address storage circuit and an initialize circuit in accordance with another embodiment of the invention.

Another exemplary configuration of the defect address storage circuit 8 is shown in FIG. 3. This circuitry is similar in principal arrangement to that shown in FIG. 2 with more than one waveform reshaping circuit 14 being inserted at an intermediate or "midway" portion of the signal line bundle 12 for transmission of respective initialize signals, which is for reshaping of the waveform of such signals. In the FIG. 3 circuitry, a specified number of waveform reshape circuits 14 are provided at several portions, wherein the number is determinable depending upon the exact length of signal lines 12 bundled, by way of example. Disposing one or more waveform reshape circuits 14 at the signal lines makes it possible to reduce or minimize unwanted signal waveform rounding or "corruption" and attenuation otherwise occurring due to parasitic capacitance and/or resistance components added to respective signal lines, thereby enabling the fuse latch circuits 11 to offer increased reliability in operation.

Figure 17:
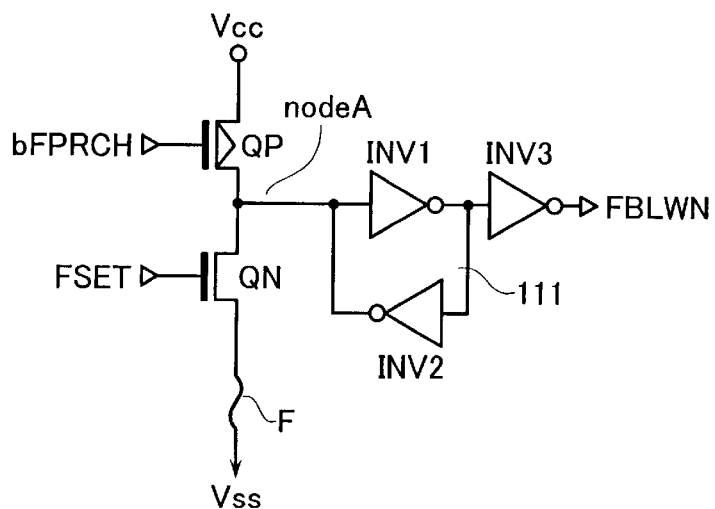
FIG. 17 is a diagram showing an arrangement of a fuse latch circuit in the defect address storage circuit unit.
Figure 18:
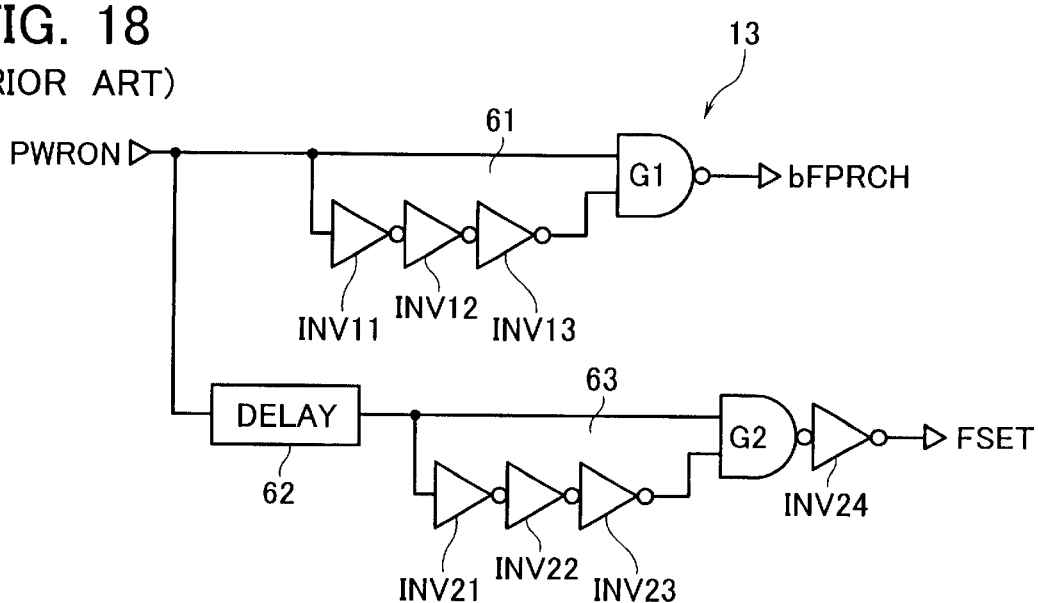
FIG. 18 is a diagram showing a configuration of an initialize circuit of the fuse latch circuit.
Figure 19:
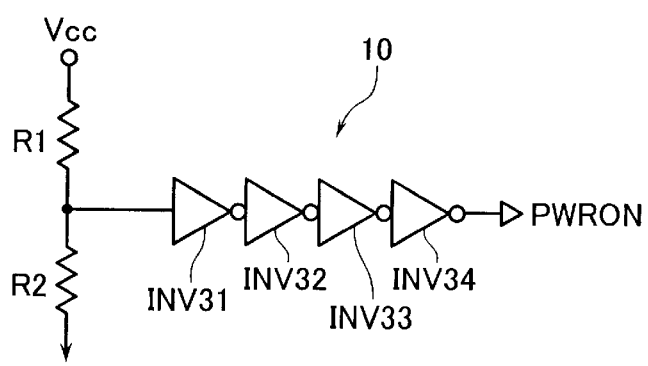
FIG. 19 is a diagram showing a configuration of a power-on circuit.
Figure 20:
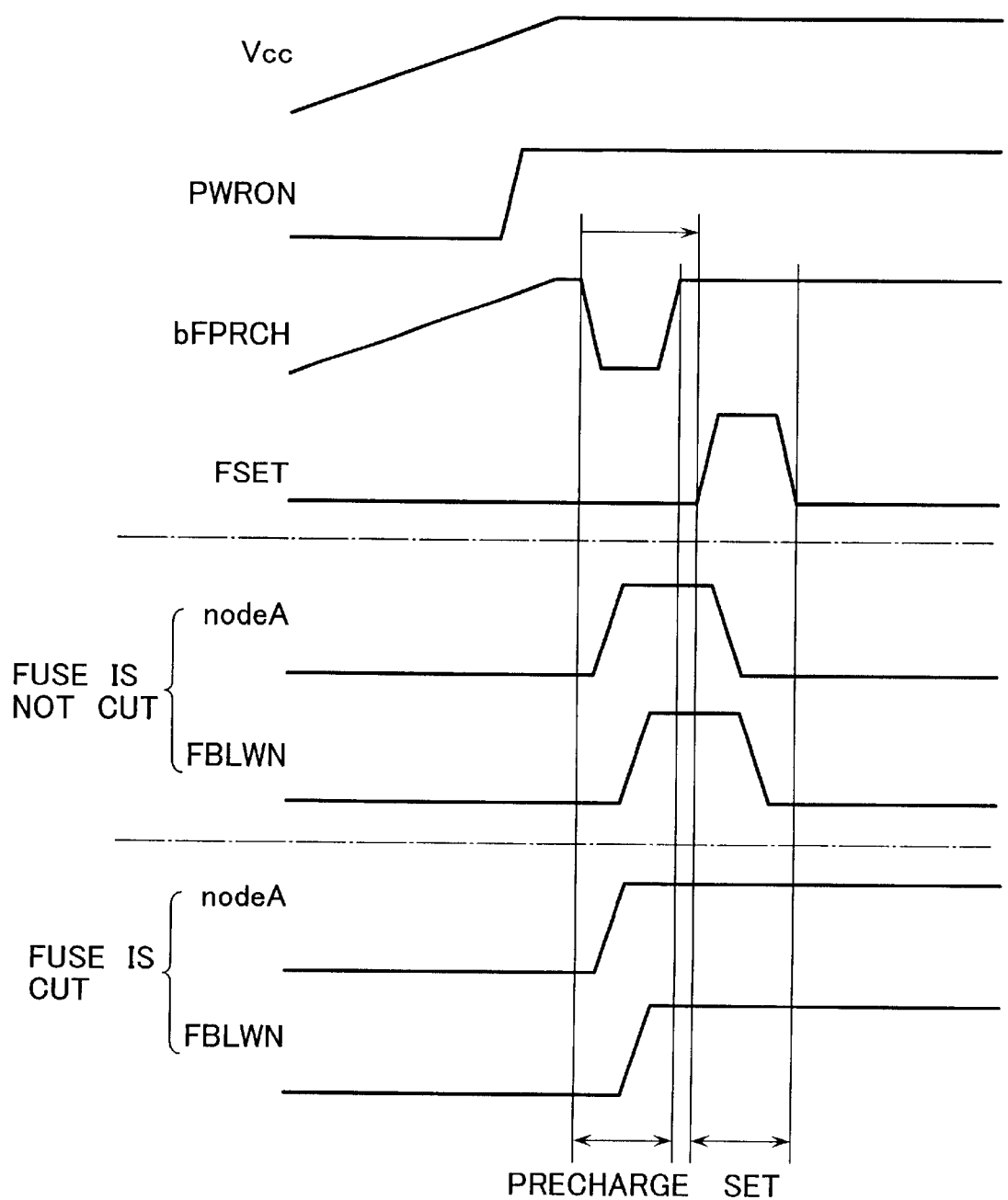
FIG. 20 is an operation timing diagram of the fuse latch circuit of FIG. 16.

It should be noted in the circuit configurations of FIGS. 2–3 that in case the fuse latch circuits 11 are each arranged in an ordinary fashion to employ a fuse F and latch 111 such as shown in FIG. 17, the first initialize signal FINIT1 may be a precharge signal bFPRCH whereas the second initialize signal FINIT2 may be a fuse set signal FSET. Accordingly in this case, the initializer circuit 13 is designable to consist of only two stages of initialize signal generator circuits 13a–13b, wherein the first-stage initialize signal generator circuit 13a functions as a precharge signal generator circuit whereas the second-stage initialize signal generator circuit 13b acts as a fuse set signal generator circuit.

Figure 4:
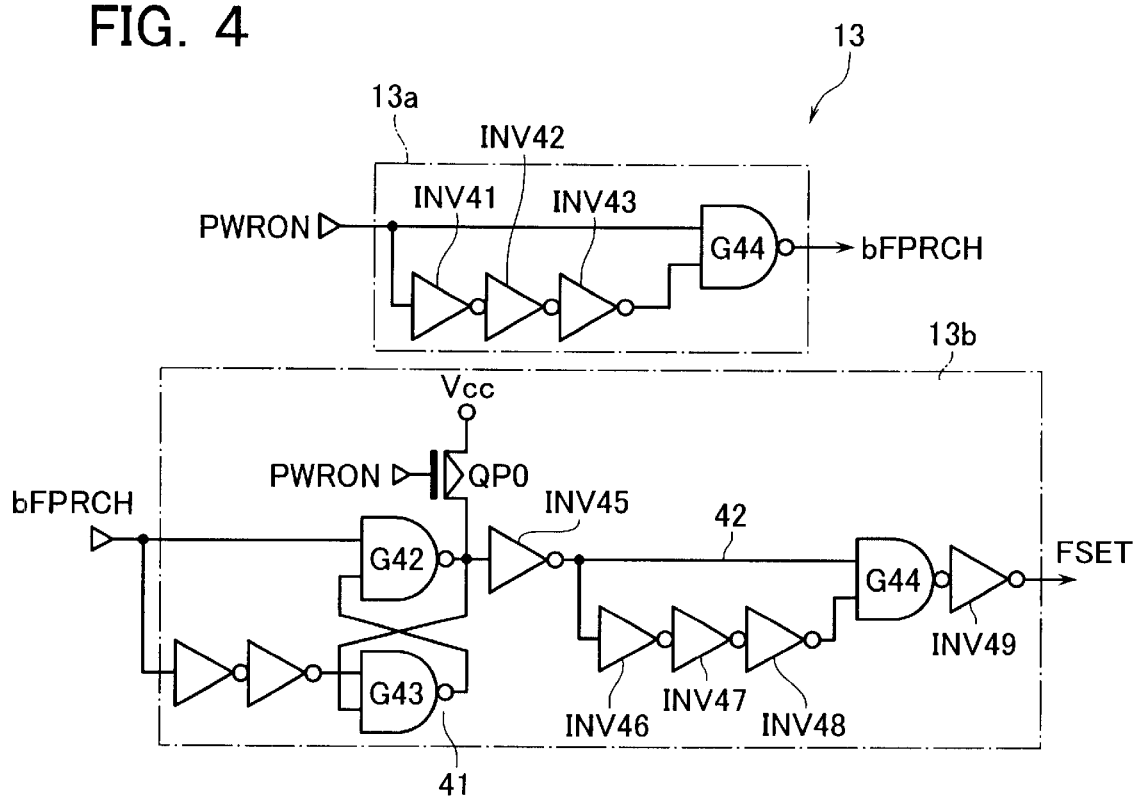
FIG. 4 is a diagram showing an exemplary configuration of the initialize circuit.
Figure 5:
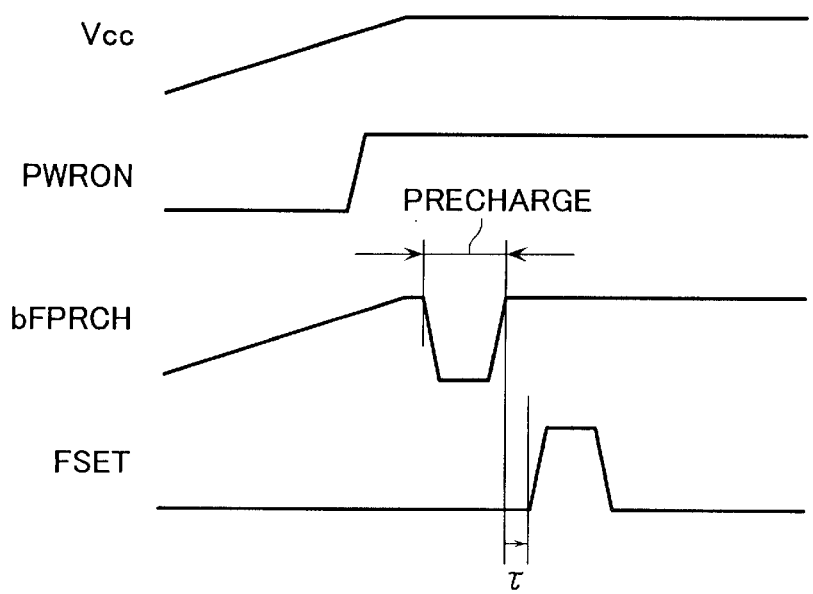
FIG. 5 is an operation timing diagram of the initialize circuit.

A practically implemented configuration of such circuitry is shown in FIG. 4, which includes a precharge signal generator circuit (first-stage initialize signal generator circuit) 13a and fuse set signal generator circuit (second-stage initialize signal generator circuit) 13b. The precharge signal generator circuit 13a is illustratively formed of a level transition detection circuit (rise-up edge detector circuit) which consists essentially of a serial combination of an odd-numbered stage of inverters INV41–INV43 and a NAND gate G41. With such an arrangement, a precharge signal bFPRCH of negative logic pulse is obtainable as shown in FIG. 5, which is determinable by a delay of the serially coupled inverters INV41–43.

The fuse set signal generator circuit 13b is mainly constituted from a flip-flop circuit 41 and a level transition detector circuit 42 operable to detect a level transition of a set output signal of it. The flip-flop 41 is formed of NAND gates G42–G43. Flip-flop 41 is reset by a P-channel metal oxide semiconductor (PMOS) transistor QPO until the power-on signal PWRON potentially goes high to reach "High" or "H" level and is set by the precharge signal bFPRCH. Whereby, as shown in FIG. 5, it outputs a fuse set signal FSET of positive logic pulse at a time point as delayed by τ from a rising edge of the precharge signal bFPRCH. The length of such delay time τ is determinable by a transfer delay on signal line 12 between the precharge signal bFPRCH as output from the precharge signal generator circuit 13a and the precharge signal bFPRCH being input to the fuse set signal generator circuit 13b.

Figure 6:
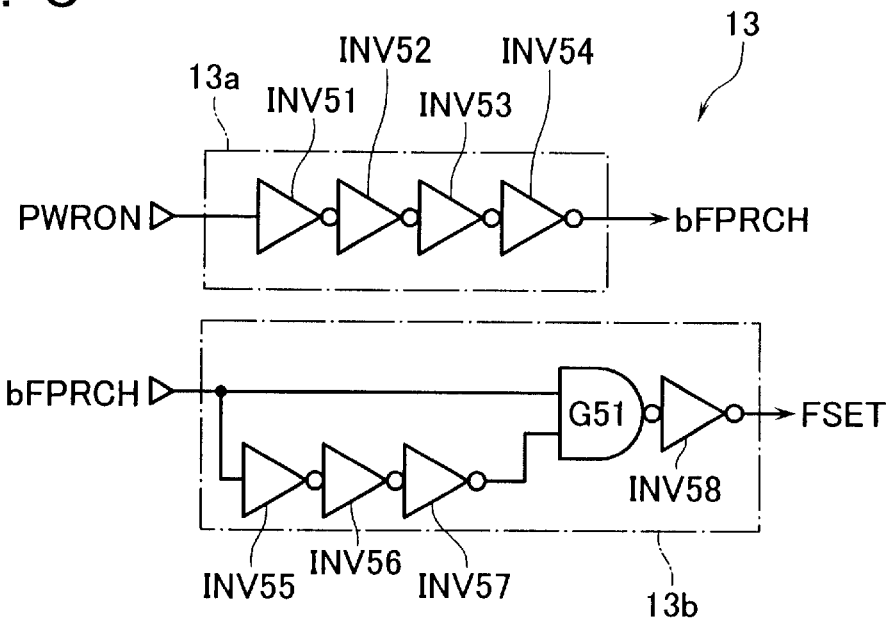
FIG. 6 is a diagram showing another exemplary configuration of the initialize circuit.
Figure 7:
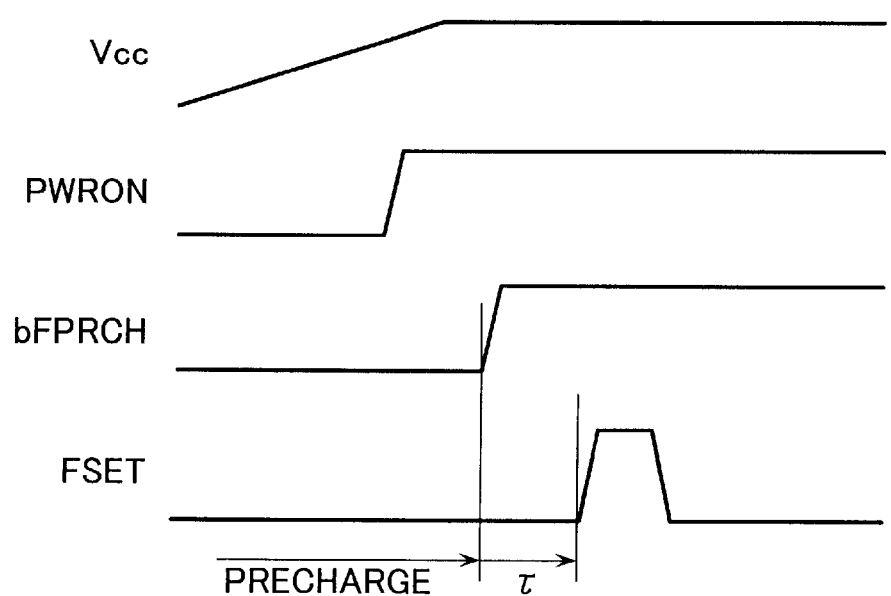
FIG. 7 is an operation timing diagram of the initialize circuit of FIG. 6.

A modified configuration of the initialize signal generator circuit 13 is shown in FIG. 6. This circuit similarly includes its precharge signal generator circuit 13a and fuse set signal generator circuit 13b. The precharge signal generator circuit 13a consists essentially of an even-numbered stage of inverters INV51–INV54. These inverters are serially coupled together to delay the rise-up edge of a power-on signal PWRON. Whereby, circuit 13b outputs a precharge signal bFPRCH, which stays at "Low" or "L" level until elapse of a specified length of time period after the power-on signal PWRON has changed in potential from "L" to "H" level as shown in FIG. 7.

The fuse set signal generator circuit 13 of FIG. 6 is illustratively a level transition detector circuit which includes an odd-numbered stage of serial coupled inverters INV55–INV57 along with a NAND gate G51 and an inverter INV58 operable to invert an output signal of the NAND gate G51. With such an arrangement, a fuse set signal FSET of positive pulse is obtainable, which is determinable by a delay of the inverters INV55–57 as shown in FIG. 7. A delay τ spanning from a rising edge of precharge signal bFPRCH up to a rise-up edge of fuse set signal FSET is determined by the delay of signal line 12 of precharge signal bFPRCH in a similar way to that of the examples shown in FIGS. 4–5.

Figure 8:
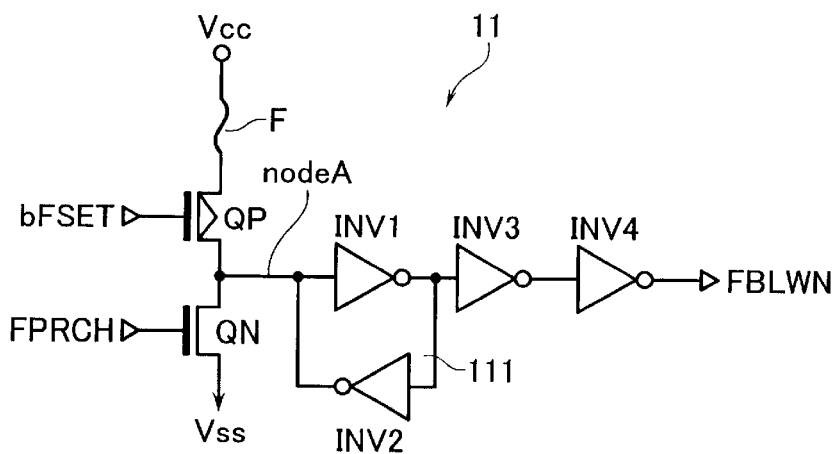
FIG. 8 is a diagram showing a configuration of a fuse latch circuit.

An exemplary configuration of the fuse latch circuit 11 is shown in FIG. 8. This circuit shown herein is different from that of FIG. 17 in that its fuse F is disposed on the power supply terminal Vcc side. A PMOS transistor QP that is laid out between the fuse F and a latch node A is for use as a fuse set-up transistor whereas an N-channel MOS (NMOS) transistor QN disposed between the latch node A and on-chip ground or "source" potential Vss is as a precharging transistor. In this fuse latch circuit, a positive logical precharge signal FPRCH and a negative logic fuse set signal bFSET are used.

Figure 9:
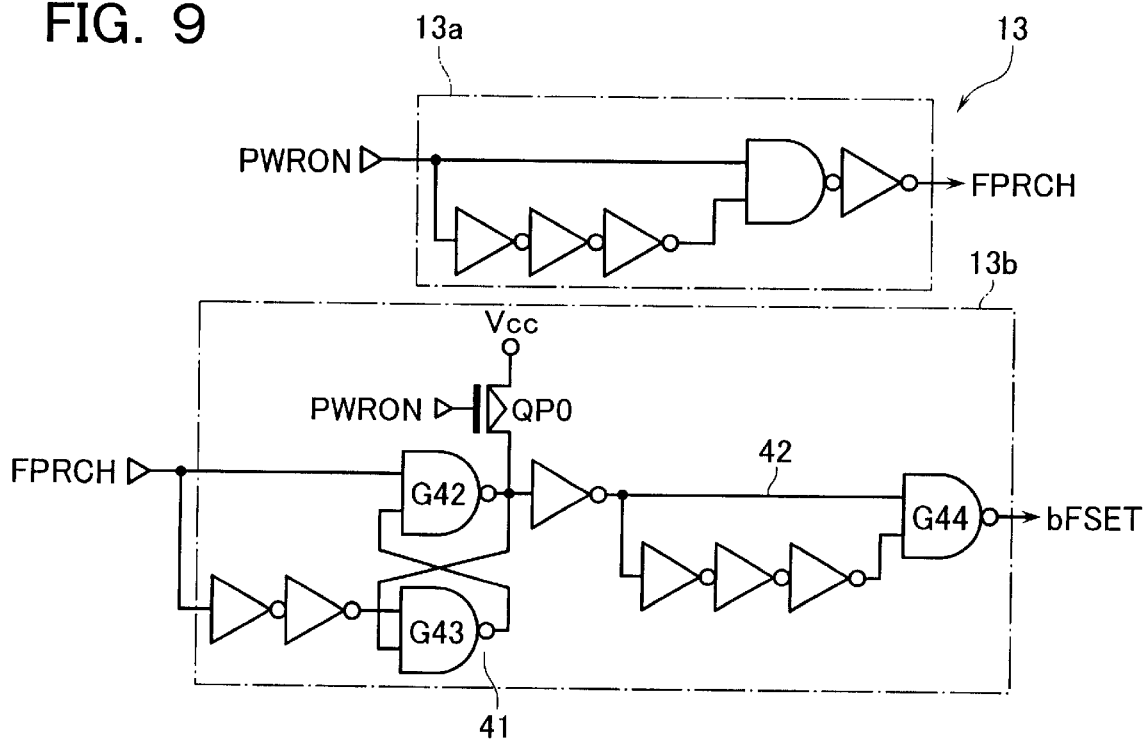
FIG. 9 is a diagram showing a configuration example of the initialize circuit arranged to employ the fuse latch circuit.
Figure 10:
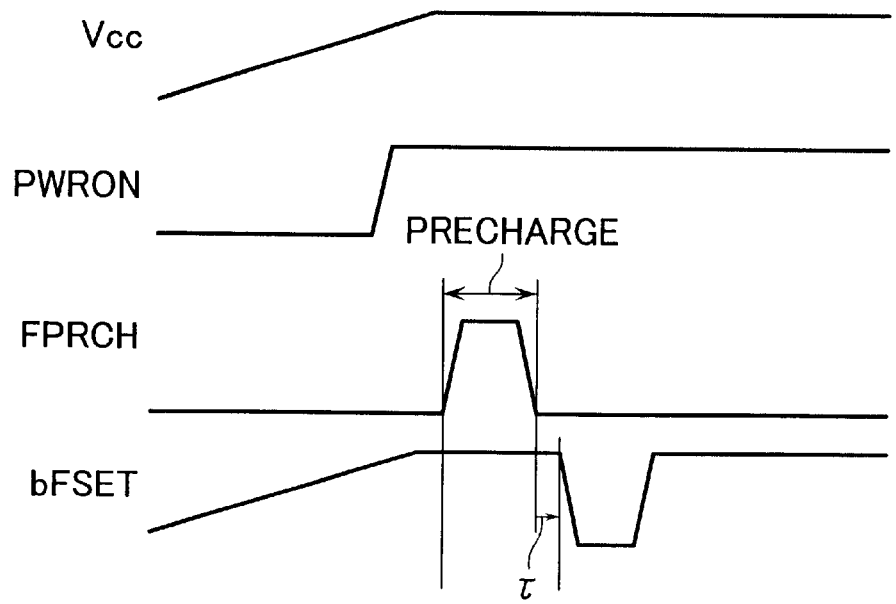
FIG. 10 is an operation timing diagram of the initialize circuit.

In the case of the fuse latch circuit configuration of FIG. 8, the precharge signal generator circuit 13a and fuse set signal generator circuit 13b are arranged in a way shown in FIG. 9 as an example. The precharge signal generator circuit 13a is a level transition detector circuit which detects a rise-up edge of the power-on signal PWRON and then generates a positive logic pulse precharge signal FPRCH as shown in FIG. 10. The fuse set signal generator circuit 13b is almost similar to that of FIG. 4 in that it consists essentially of a flip-flop 41 and its associative level transition detector circuit 42 for detection of a transition of an output of flip-flop 41. As shown in FIG. 10, this fuse set signal generator circuit 13b is operatively responsive to receipt of a precharge signal FPRCH for outputting a fuse set signal bFSET of negative logic pulse. As in the two examples stated supra, a delay τ ranging from a fall-down edge of precharge signal FPRCH up to a rise-up edge of fuse set signal FSET is determinable by the delay due to the signal line 12 of precharge signal FPRCH.

Figure 11:
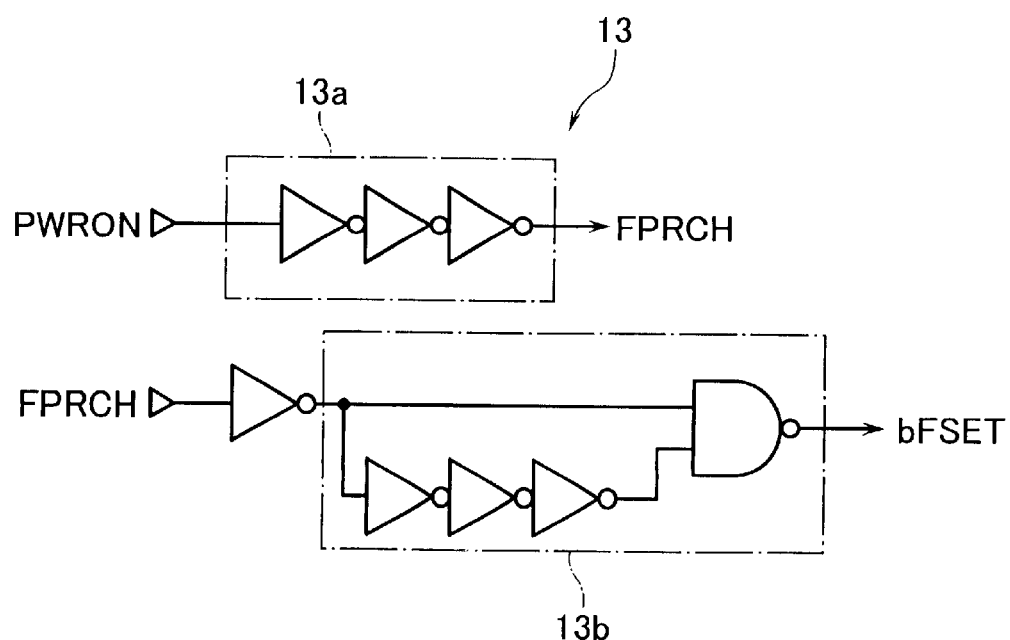
FIG. 11 is a diagram showing a still another exemplary configuration of the initialize circuit.
Figure 12:
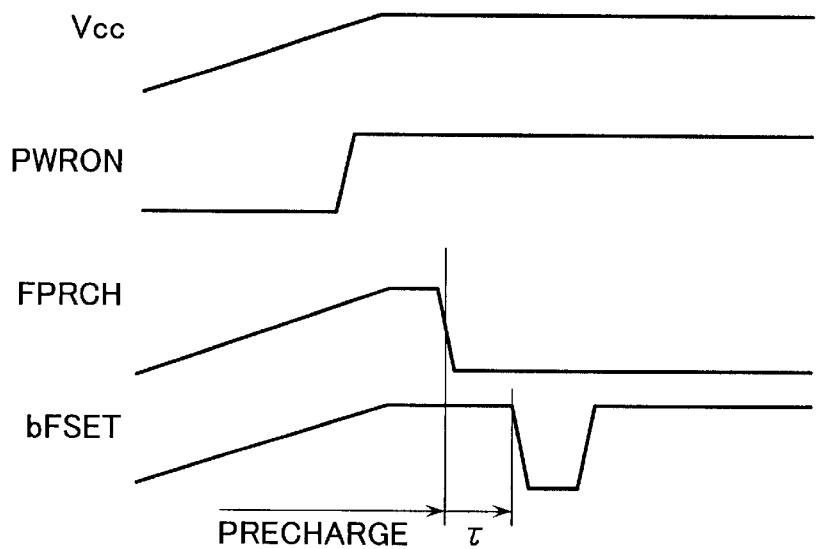
FIG. 12 is an operation timing diagram of the initialize circuit of FIG. 11.

Another exemplary configuration of initialize circuitry 13 using the fuse latch circuit of FIG. 8 is shown in FIG. 11, which includes its precharge signal generator circuit 13a and fuse set signal generator circuit 13b. The precharge signal generator circuit 13a shown is an odd-numbered stage inverter chain for delaying the rise-up of a power-on signal PWRON, which generates a precharge signal FPRCH which is a positive logic pulse with a prespecified time width from the riseup of power-on signal PWRON as shown in FIG. 12. The fuse set signal generator circuit 13b is a level transition detector circuit for detection of a falling edge of precharge signal FPRCH; as shown in FIG. 12, it outputs a fuse set signal bFSET of negative logic pulse. A delay τ of from the fail-down edge of precharge signal FPRCH to a riseup edge of fuse set signal FSET is determined by the delay due to the precharge signal FPRCH transmission line 12.

Although a respective one of the above-stated embodiments is designed to employ laser-blowable fuse elements in the defect address storage circuit 8, this invention may also find in application for those using electrical fuse (capacitive fuse) elements. See FIG. 13, which depicts an exemplary circuit for use as a fuse latch circuit 11 using an electrical fuse EF. Initializing this fuse latch circuit 11 requires an increased number of initialize signals when compared to the case employing laser fuses. More specifically, those initialize signals required to be sequentially activated include, in addition to the precharge signal bFPRCH and fuse set signal FSET as in the previous embodiments, a readout signal EFOPEN used to read data out of an electrical fuse EF and then send it to a latch 131 via a transfer gate and a signal bEFPRCH for control of activation of this latch 131, wherein these signals EFOPEN, bEFPRCH are to be generated prior to issuance of the above signals bFPRCH, FSET. These initialize signals are sequentially generated by use of an initializer circuit 13 shown in FIG. 14, which includes several initialize signal generator circuits 13a to 13d.

Figure 13:
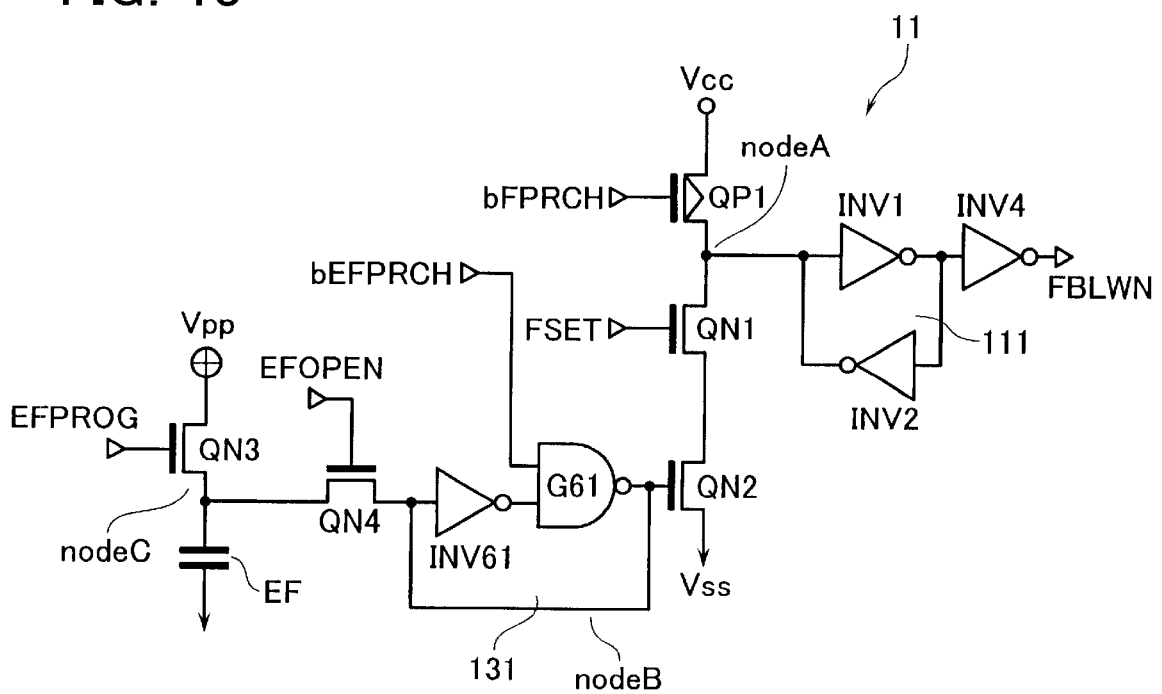
FIG. 13 is a diagram showing a configuration of a fuse latch circuit using an electrical fuse element.
Figure 14:
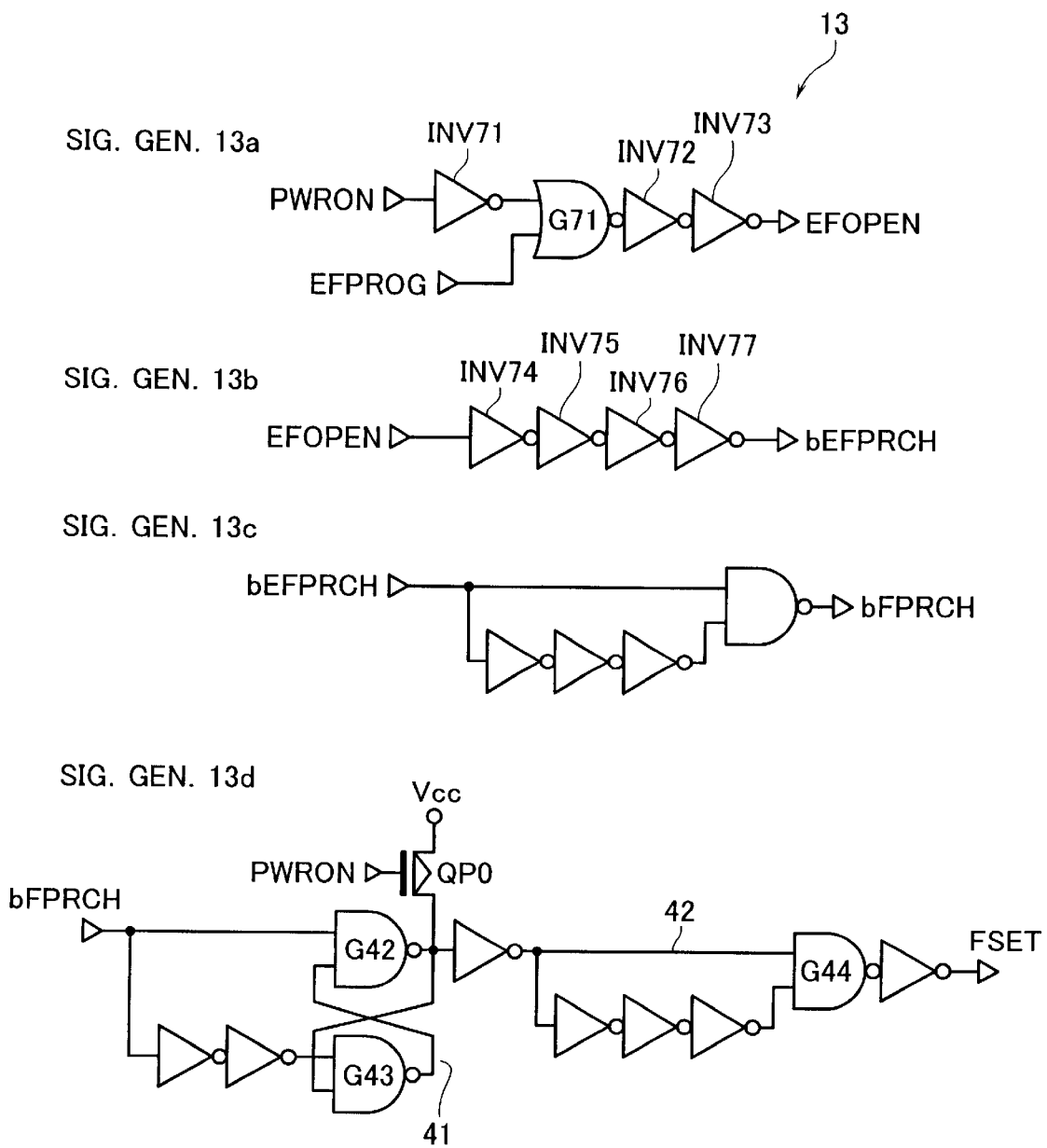
FIG. 14 is a diagram showing a configuration of an initialize circuit for initialization of the fuse latch circuit.

With the fuse latch circuit 11 of FIG. 13, the electrical fuse EF is programmed by application of a potentially raised or "boosted" power supply voltage Vpp thereto via an NMOS transistor QN3, which is driven to turn on in response to a program signal EFPROG. At this time an NMOS transistor QN4 for use as the transfer gate is kept nonconductive, i.e. turned off, to ensure that the high voltage Vpp is rarely applied to any portions residing behind a node B.

Data indicative of whether the electrical fuse EF is presently shortened or not is stored at a node C, which is potentially set at either "L" or "H" level. The data of this node C is sent forth toward the node B via the NMOS transistor QN4 being driven by a read signal EFOPEN and is then temporarily held at the latch 131. The resultant state of this node B determines turn-on or off of a sense-use NMOS transistor QN2. When node B is at "H" level, NMOS transistor QN2 turns on, which is equivalent to a specific case where a fuse in laser fuse latch circuitry is not yet cut off—that is, the fuse stays in the electrical conduction state. Alternatively when node B is at "L" level, NMOS transistor QN2 turns off, which is equivalent to the case where the fuse is cut—i.e. electrically opencircuited. As in the case of using laser fuses, the exact state of the sensing NMOS transistor QN2 is read into the latch 111 in responding to receipt of a precharge signal bFPRCH and fuse set signal FSET and is then held therein. A final output signal FBLWN is set at "L" or "H" in accordance with cut-off (electrical opencircuit) or anti-cutoff (shortcircuit) of the electrical fuse EF.

Figure 15:
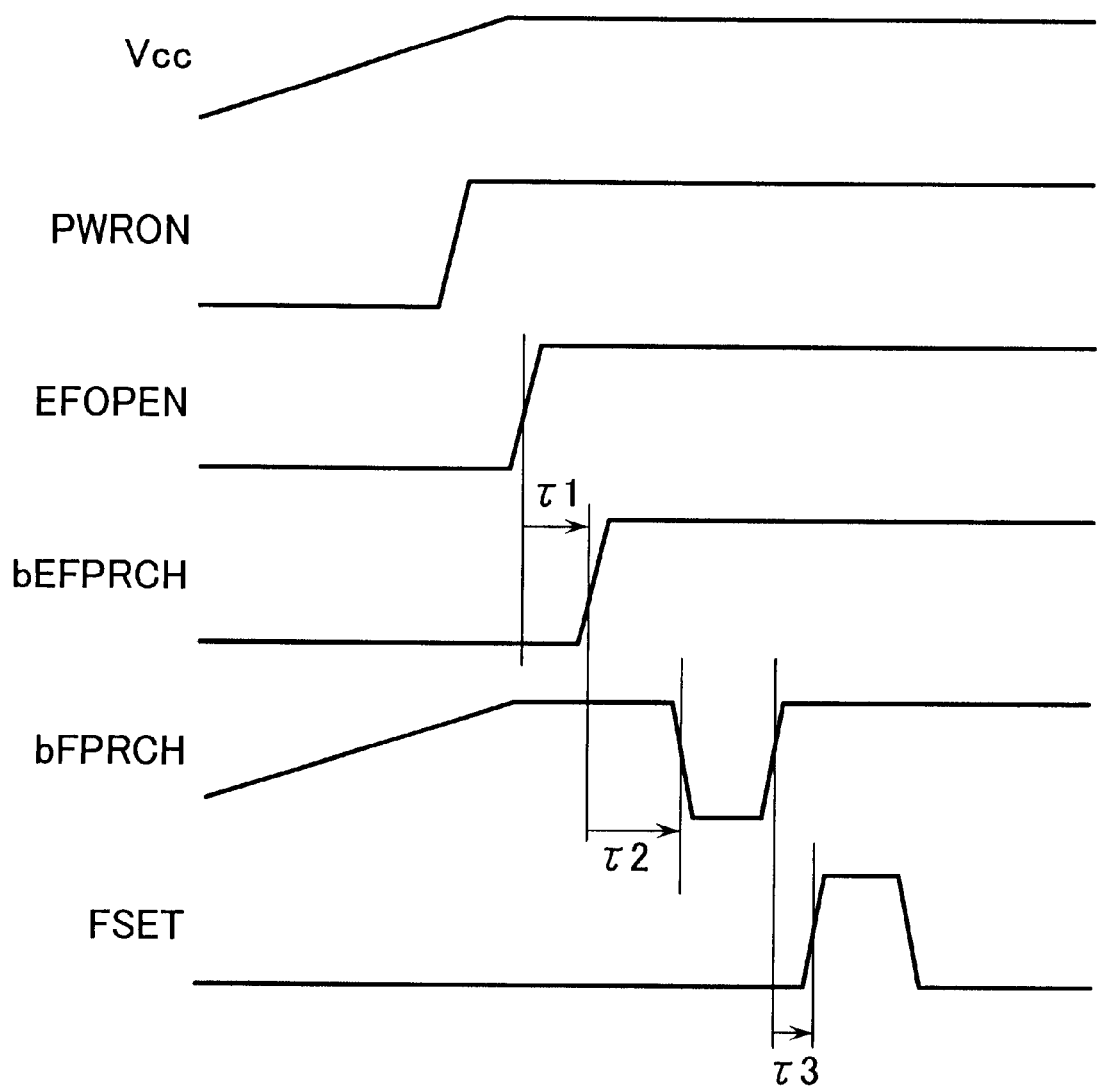
FIG. 15 is an operation timing diagram of the fuse latch circuit.
Figure 16:
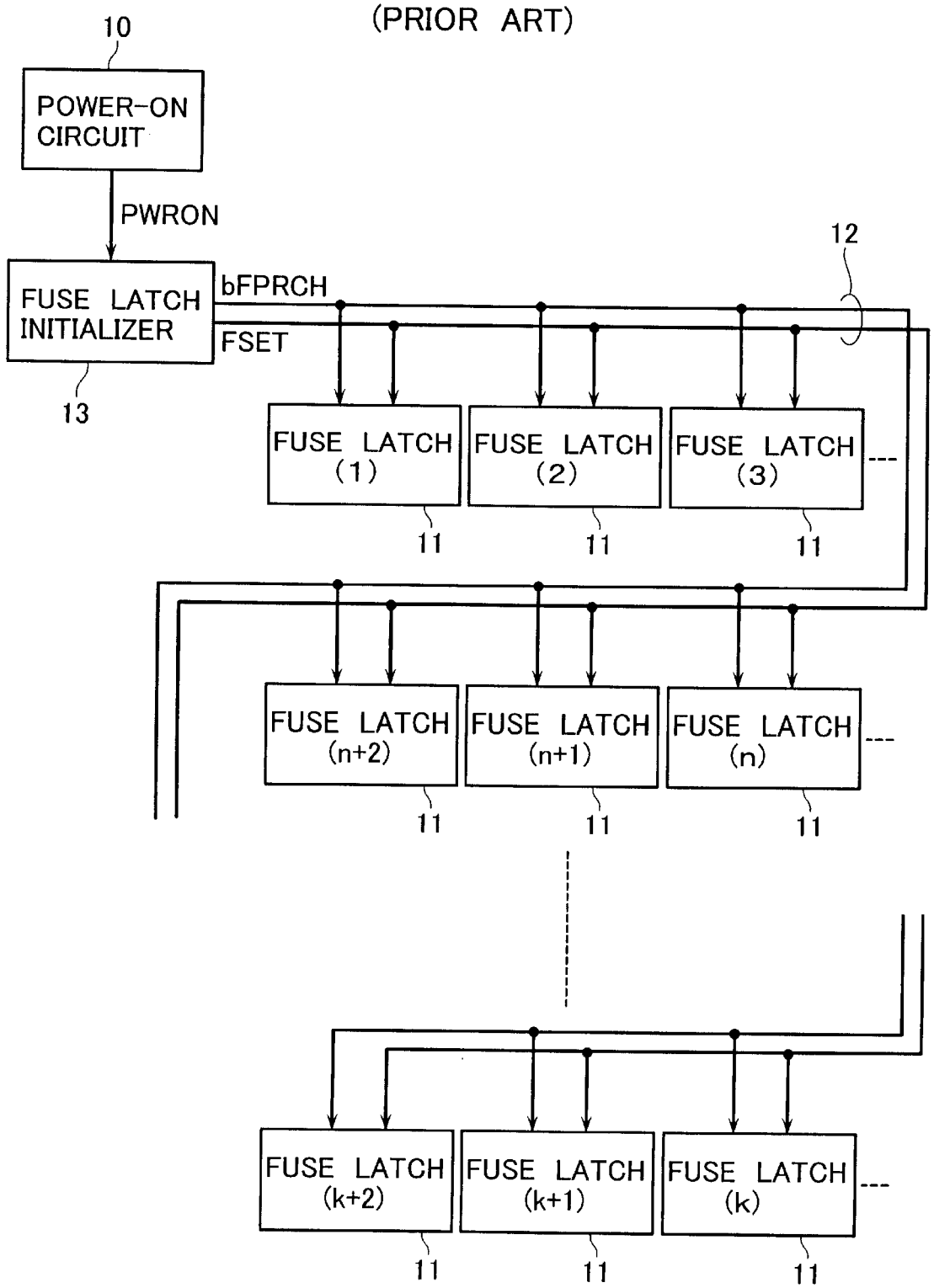
FIG. 16 is a diagram showing a configuration of a defect address storage circuit unit in prior known semiconductor memory chips.

See FIG. 15. This diagram shows waveforms of major signals as sequentially generated in response to receipt of the power-on signal PWRON, which include a read signal EFOPEN, activation signal bEFPRCH, precharge signal bFPRCH and fuse set signal FSET. The first-stage initialize signal generator circuit 13a is a read signal generation circuit which is rendered operative only after completion of a fuse program operation (EFPROG="L") to generate a read signal EFOPEN that is a time delayed version of the power-on signal PWRON by a chain of an inverter INV7, NOR gate G71, and inverters INV72, INV73. When the read signal EFOPEN goes high in potential (EFOPEN="H"), the NMOS transistor QN4 of FIG. 13 turns on causing the fuse data at node C to be sent to node B.

More specifically, in case the fuse is not programmed, the nodes B, C are set at "H" level. This state is held at a latch 131 consisting of an inverter INV61 and NAND gate G61 even when the signal bEFPRCH becomes "H" level. On the other hand, when the electrical fuse EF is programmed, the opposite plate electrodes or "poles" of electrical fuse EF are conducted; thus, when setting EFOPEN="H," charge-up of NAND gate G61 and discharge of electrical fuse EF collide or impinge together resulting in both nodes B, C becoming in potentially unstable states.

The second-stage initialize signal generator circuit 13b which is formed of a chain of even-numbered stage inverters INV74–INV77 to receive the read signal EFOPEN is an activation signal generation circuit for activation of the latch 131. Upon generation of an activation signal bEFPRCH= "H," chargeup from NAND gate G61 stops causing the nodes B, C to be set and held at "L" due to discharging of the electrical fuse EF. With the operations stated above, turn-on or off of the sense-use NMOS transistor QN2 is determined in accordance with the state of electrical fuse EF.

An operation to be done thereafter is similar to that of the previous embodiments using laser fuses. Specifically a third-stage initialize signal generator circuit 13c similar in configuration to the initialize signal generator circuit 13a of FIG. 4 generates a precharge signal bFPRCH. After elapse of a certain delay time from the issuance of this precharge signal bFPRCH, a fuse set signal FSET is generated by a fourth-stage initialize signal generator circuit 13d similar in arrangement to the initialize signal generator circuit 13b of FIG. 4. By these precharge signal bFPRCH and fuse set signal FSET, a read output FBLWN of fuse information is assured.

In the case of this embodiment also, respective stages of initialize signal generator circuits are serially linked together in such a way that after an output signal of the first-stage initialize signal generator circuit 13a has been supplied to all the fuse latch circuits, a signal appearing at the terminate end of its transfer path is sent as an activation signal toward the second-stage initialize signal generator circuit 13b followed by similar operations at the remaining initialize signal generator stages; thus, it becomes possible to give the required initialize signals to all the fuse latch circuits while letting them retain a fixed order of sequence. To be brief, in the timing diagram shown in FIG. 15, delay times $\tau 1, \tau 2, \tau 3$ are well guaranteed at every fuse latch circuit. This makes it possible to preclude operation failures.

Although in the above-stated embodiments the control data storage circuit is formed of defect address storage circuitry for use in fault-tolerant repairable semiconductor memory chips with redundancy circuit architectures for defect management and defective cell replacement, this invention should not be limited only thereto. The principles of the invention are also effective when applied for example to those designed to store as the control data a variety of kinds of chip information items such as chip identification (ID) information, circuit's trimming information or the like, along with or separately from the defect address(es). Also note that although the control data storage circuit discussed above is designed to employ fuse latch schemes, this invention is also applicable without requiring any specific modifications to the case of employing other storage circuit designs using known nonvolatile memory cells such as electrically erasable programmable read-only memory (EEPROM) cells.

Further note that more generically, this invention is similarly applicable to integrated circuit chips having multiple functional circuits such as the ones that are controlled by several timing-different control signals, respectively. Practically such functional circuits may alternatively be configured from binary counters.

Figure 21:
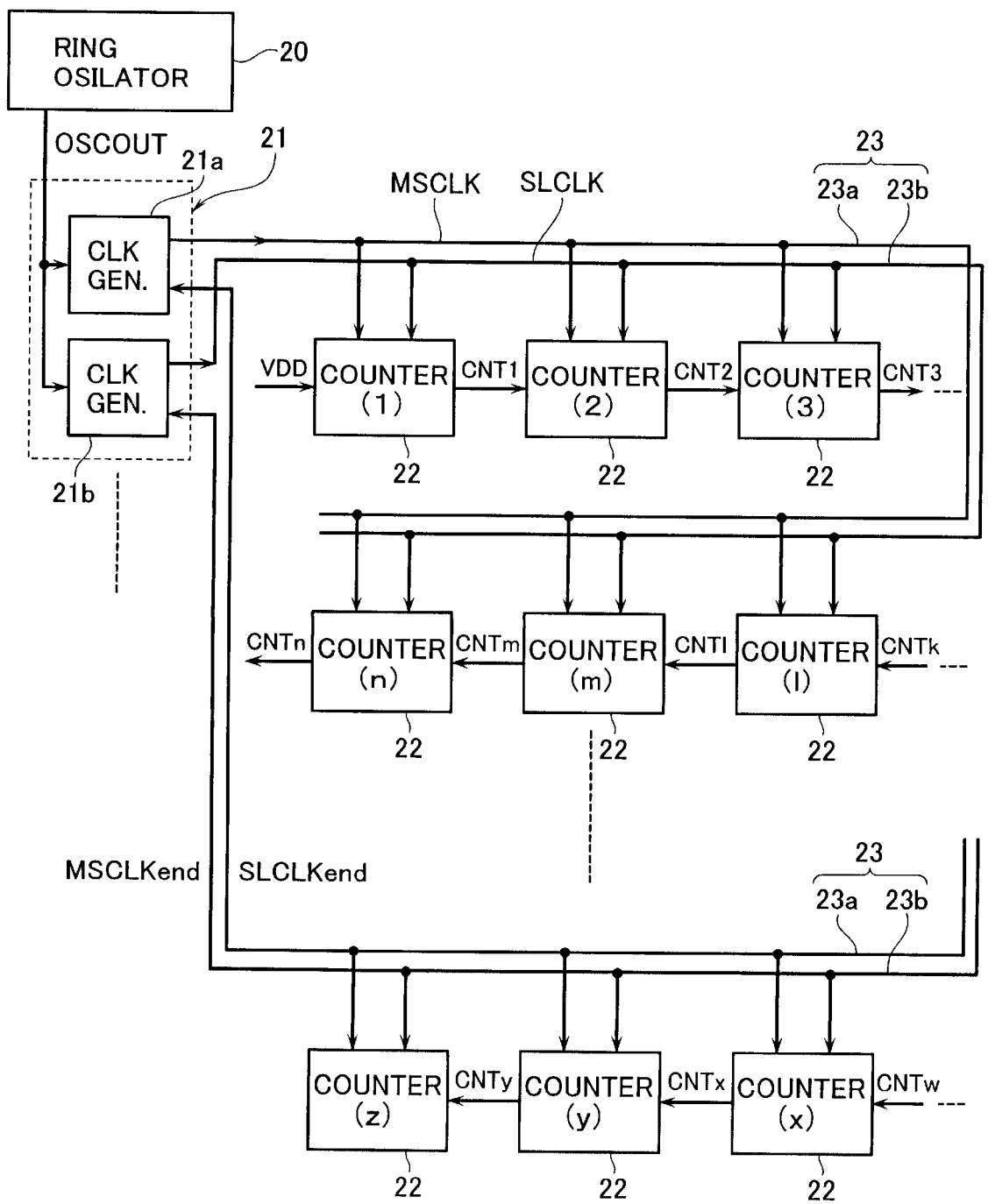
FIGS. 21 and 22 are diagrams each showing a configuration of a binary counter in accordance with a further embodiment of the invention.

See FIG. 21. This diagram shows an embodiment with this invention applied to a binary counter. The binary counter is formed of a serial combination of multiple counter circuits 22, each of which is controllable by a master clock signal MSCLK and a slave clock signal SLCLK. These clock signals MSCLK, SLCLK are generated by a control clock generation circuit 21 based on an output signal OSCOUT of a ring oscillator 20. The clock signals MSCLK, CLCLK are supplied to every counter circuit 22 via a bundle of signal transmission lines 23—namely, a master clock signal line 23a and slave clock signal line 23b.

Figure 23:
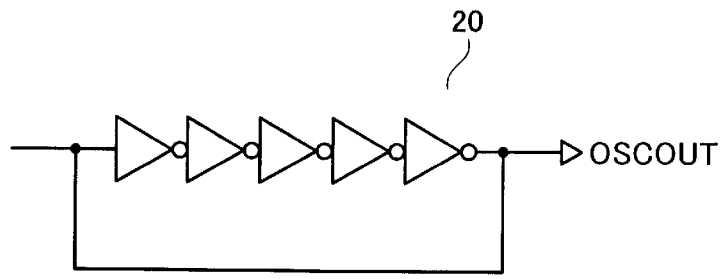
FIG. 23 is a diagram showing a configuration of a ring oscillator shown in FIGS. 21–22.
Figure 24:
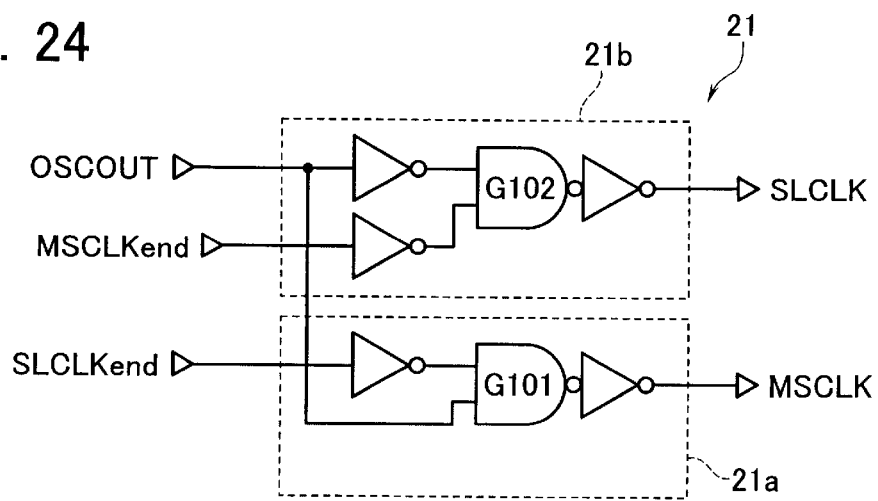
FIG. 24 is a diagram showing a configuration of a control clock generator circuit of FIGS. 21–22.

As shown in FIG. 23, the ring oscillator 20 is configured from an odd-numbered stage of inverters connected together into a closed loop of "ring"-like form. As shown in FIG. 24 the control clock generator circuit 21 is formed of a master clock generator unit 21a and a slave clock generator unit 21b. These clock generators 21a–21b are designed to employ NAND gates G101–G102 as main components thereof. With traditional schemes, these clock generators 21a–b have input and output nodes which are directly linked together. More specifically a clock MSCLK as output from master clock generator 21a becomes an input of slave clock generator 21b whereas a clock SLCLK as output from slave clock generator 21b becomes an input to master clock generator 21a.

In contrast, this embodiment is specifically arranged so that the master clock generator unit 21a and slave clock generator unit 21b are linked together via the signal lines 23. With this linkage feature, a clock MSCLK as output from the master clock generator 21a is transferred over a signal line 23a to provide a signal MSCLKend obtained at its terminate end, which becomes an input of the slave clock generator 21b. Similarly a clock MSCLK being output from the slave clock generator 21b is sent via a signal line 23b, causing a signal SLCLKend appearing at its terminate end to become an input of master clock generator 21a.

Figure 25:
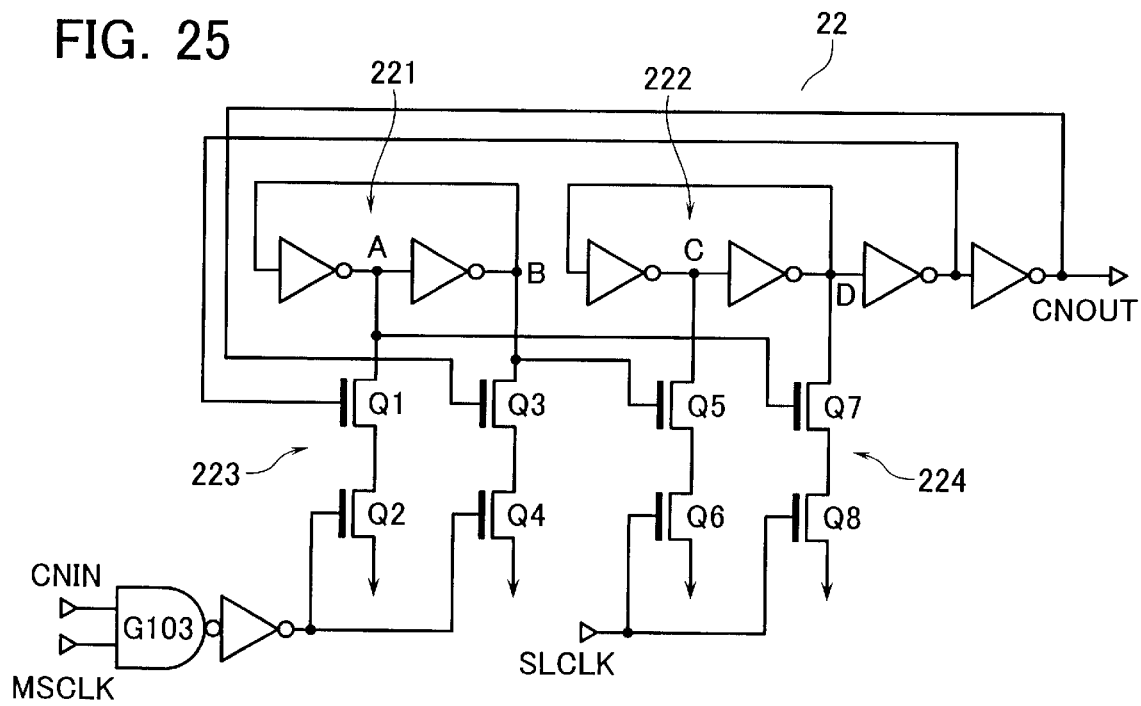
FIG. 25 is a diagram showing a configuration of a counter circuit of FIGS. 21–22.

As shown in FIG. 25 the counter circuits 22 each include a master latch 221 and a slave latch 222. Master latch 221 has circuit nodes A and B. A serial combination of NMOS transistors Q1–Q2 is connected between the latch node A and ground potential. Another serial combination of NMOS transistors Q3–4 is between the latch node B and ground. These transistor arrays Q1–2 and Q3–4 make up a logic gate 223 which determines an output state of slave latch 222 and also states of nodes A–B based on master clock MSCLK. Similarly the slave latch 222 has node C and D with a serial combination of NMOS transistors Q5–6 connected between node C and ground and with a serial combination of NMOS transistors Q7–8 coupled between node D and ground. These transistor arrays Q5–6, Q7–8 constitute a logic gate 224 for determination of an output state of master latch 221 and states of nodes C–D by slave clock SLCLK.

An operation of this counter circuit 22 is as follows. When the ring oscillator 20 is made active, its oscillation output signal OSCOUT potentially changes from "L" to "H" level, causing the slave clock SLCLK to change in potential from "H" to "L" level in the control clock generator circuit 21, as shown in FIG. 26. In responding thereto, master clock MSCLK changes from "L" to "H" level. Thereafter similar operations are repeated resulting in alternate generation of master clock MSCLK and slave clock SLCLK.

Suppose that an initial state of the counter circuit 22 is such that its nodes A, C are set at "H" level whereas nodes B, D stay at "L" level with an output signal CNOUT being set at "L" level. As far as an input signal CNIN stays at "L," the NAND gate G103 is made inactive causing counter circuit 22 to retain the initial state. While the input CNIN potentially goes high to reach "H," when master clock MSCLK exhibits toggle-like level transitions between "L" and "H" ("L"→"H"→"L"), the node A potentially changes from "H" to "L" level. In response thereto, node B changes from "L" to "H." Next, when slave clock SLCLK changes in potential from "L" to "H," node C changes from "H" to "L"; in responding thereto, node D changes from "L" to "H"; further in reply thereto, output CNOUT changes from "L" to "H" level.

Owing to the next toggle-like level transitions of "L"→"H"→"L" of the master clock MSCLK, the node B becomes "H"→"L." In responding to this level change, the node A becomes "L"→"H." When its subsequent slave clock SLCLK's toggle-like level transitions of "L"→"H"→"L," the node D becomes "H"→"L"; in responding thereto, the node C becomes "L"→"H," resulting in the output CNOUT to become "H"→"L." In this way, the count output CNOUT exhibits a single operation period or cycle which is equivalent to a time duration corresponding to two periods of the master clock MSCLK and slave clock SLCLK.

Figure 22:
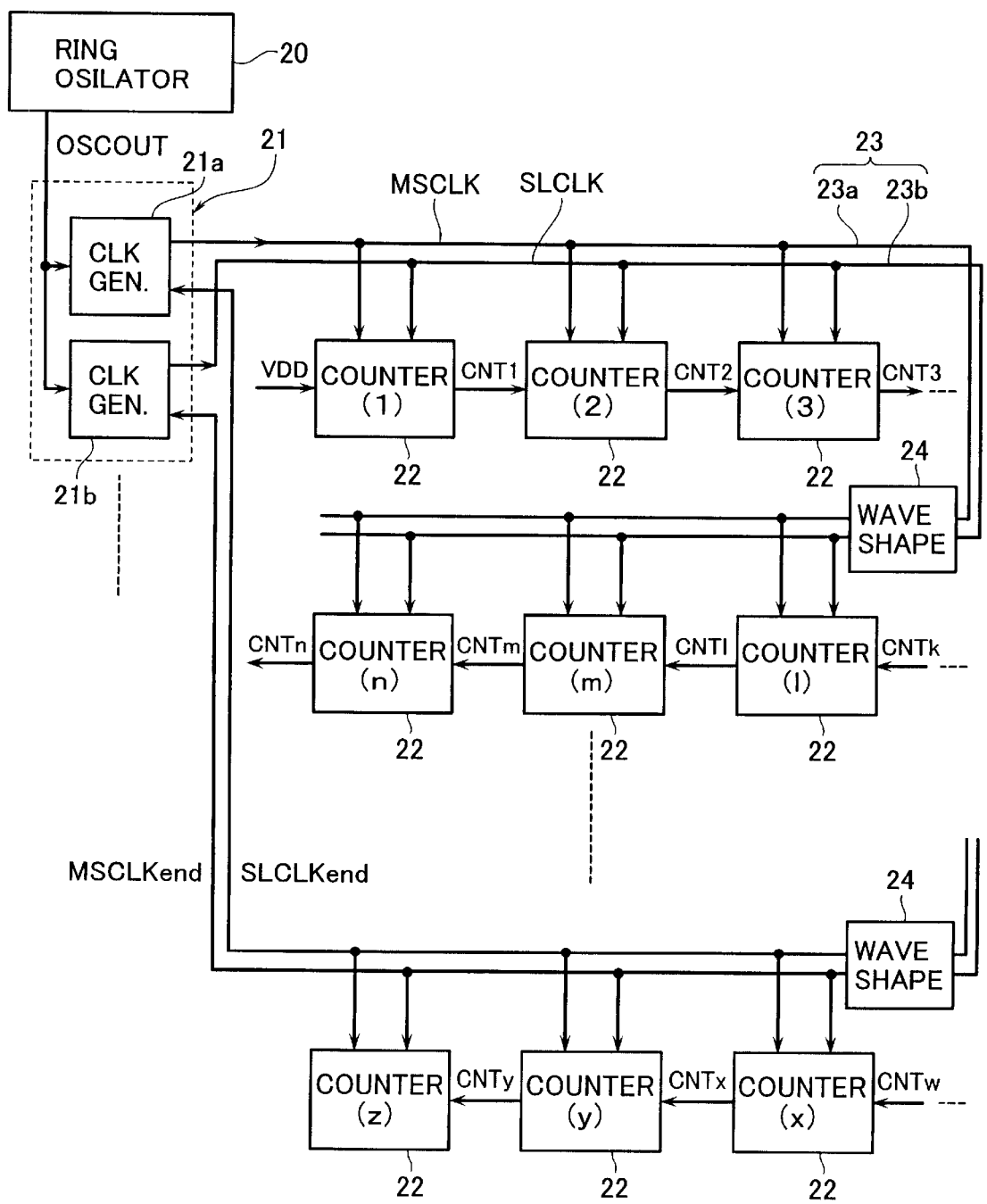

By letting multiple counter circuits 22 each similar in configuration to that of FIG. 25 be cascade-connected together as shown in FIG. 22 in such a manner that a front-stage circuit output CNOUT becomes an input CNIN of its subsequent circuit at the stage next thereto, the second counter circuit is expected to operate with a cyclic period tow times greater than that of the first counter circuit whereas the third counter circuit operates with its unique period three times greater than that of the first counter circuit as well demonstrated in FIG. 26. Accordingly, letting each counter circuit's output CNT1, CNT2, CNT3, . . . be taken as an output at each digit of a count signal permits the circuitry to function as the intended binary counter.

In such a conventional system that the control clocks MSCLK, SLCLK are directly linked in the control clock circuit 21, upon occurrence of an overlap or "duplication" of "H" level time periods of the master clock MSCLK and slave clock SLCLK while these are being supplied via the signal lines 23 (23a, 23b) to multiple counter circuits 22, an event of incapable of accurately determining the resultant state—say, state indeterminability—can accidentally take place, which in turn leads to occurrence of operation failures or malfunctions.

Fortunately with this embodiment, such "H" period overlap accidents of these clocks MSCLK, SLCLK may reliably be avoided because of the fact that the clock generator units 21a–21b for generation of the clocks MSCLK, SLCLK are linked together via the signal lines 23a, 23b. In detail, the required slave clock SLCLK is first generated after the master clock MSCLK has been supplied to every counter circuit 22; similarly, the master clock MSCLK is generated after slave clock SLCLK has been fed to every counter circuit 22.

FIG. 26, which ignores any delays within the control clock generator circuit 21, demonstrates by use of broken lines the behavior of level transition of a slave clock SLCLK in response to receipt of level transition of a terminate-end signal MSCLKend obtained after a master clock MSCLK has been transferred over signal line 23a and also level transition of master clock MSCLK in responding to receipt of level change of a terminate-end signal SLCLKend obtained after slave clock SLCLK has been sent via signal line 23b. Delay times τ11, τ12 as shown herein indicate maximal delays at signal lines 23a–23b respectively.

According to this embodiment arranged in the way stated above, undesired overlapping of two kinds of clock signals is prevented, thus precluding operation failures of the binary counter circuitry.

Turning to FIG. 22, there is shown another exemplary configuration of binary counter circuitry, which is similar to that of FIG. 21 with waveform reshaping circuits 24 inserted at selected portions of the clock signal lines 23. These circuits added are for performing waveform reshaping of respective clock signals being transferred. Letting the waveform reshaper circuits be laid out at several portions in this way makes it possible to suppress unwanted waveform corruption and/or attenuation otherwise occurring due to the presence of parasitic capacitance and/or parasitic resistance components, which in turn enables improvements in operation reliability of the clock circuits used.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor integrated circuit device comprising:
a plurality of functional circuits;
a plurality of signal lines associated with said functional circuits for transfer of a plurality of control signals different in timing from one another to be supplied to each said functional circuit; and
a control circuit configured to generate said control signals, wherein
said control circuit includes a plurality of stages of control signal generation circuits for generating said control signals respectively, and wherein said control signal generation circuits are linked together so that when a control signal generation circuit at a certain stage outputs a control signal to be transferred over a corresponding signal line, another control signal generation circuit at a stage next thereto is made active in response to the control signal.

2. The device according to claim 1, wherein said functional circuits are control data storage circuits as arranged to outputtably retain programmed control data therein, wherein said control circuit is an initialize circuit for permitting performance of readout and retain operations of the programmed control data of said control data storage circuits, and wherein said plurality of stages of control signal generation circuits are initialize signal generator circuits for generating initialize signals to be supplied to each said control data storage circuit via said signal lines respectively.

3. The device according to claim 2, further comprising:
a waveform reshaping circuit as inserted to at least one portion of said signal lines.

4. The device according to claim 2, wherein each of said control data storage circuits is a defect address storage circuit for storing therein an address of a defect in a memory cell array and for controlling, when the defect address is accessed, replacement of a corresponding defective cell array with a redundancy cell array.

5. The device according to claim 4, wherein said defect address storage circuit includes a fuse latch circuit having a laser-meltable fuse element and a latch for reading data out of the fuse and for storing the data therein, and wherein
said plurality of stages of initialize signal generator circuits include a precharge signal generator circuit for generating a precharge signal used to initialize a latch node of each of said fuse latch circuits and a fuse set signal generator circuit activatable by said precharge signal as transferred to each fuse latch circuit via a corresponding signal line for generating a fuse set signal used to read and store fuse data of each fuse latch circuit.

6. The device according to claim 4, wherein said defect address storage circuit includes a fuse latch circuit having an electrical capacitive fuse, a first latch for reading data of said electrical capacitive fuse via a transfer gate and for storing the data therein, a sense-use transistor operatively responsive to receipt of data of said first latch for performing a turn-on/off switching operation, and a second latch for reading and holding a state of said transistor therein, and wherein
said plurality of stages of initialize signal generator circuits include a read signal generator circuit for generating a read signal used to drive said transfer gate, an activation signal generator circuit activatable by said read signal as output from said read signal generator circuit and sent to each said fuse latch circuit via a first signal line for generating an activation signal used to make said first latch active, a precharge signal generator circuit activatable by said activation signal as output from said activation signal generator circuit and sent to each said fuse latch circuit via a second signal line for generating a precharge signal for initialization of a latch node of said second latch, and a fuse set signal generator circuit activatable by said precharge signal as output from said precharge signal generator circuit and sent to each said fuse latch circuit via a third signal line for generating a fuse set signal used for transfer of data of said sense-use transistor toward said second latch and then storage of the data therein.

7. The device according to claim 1, wherein said plurality of functional circuits are a serial combination of counter circuits with an output of a certain stage as an input of another stage next thereto for being operable in response to first and second clock signals different in timing from each other, and wherein
said plurality of stages of control signal generation circuits have a first clock signal generator unit for detecting level transition of the second clock signal to generate said first clock signal and a second clock generator unit for detecting level transition of said first clock signal to generate said second clock signal, said first and second clock signals being transferred to each counter circuit via corresponding signal lines input to said second clock signal generator unit and said first clock signal generator unit respectively.

8. A semiconductor integrated circuit device comprising:
a plurality of control data storage circuits as arranged to outputably store therein programmed control data; and
an initialize circuit configured to permit execution of readout and retain operations of the programmed control data of these control data storage circuits, wherein
said initialize circuit has a plurality of stages of initialize signal generator circuits for supplying each said data storage circuits signal with a plurality of initialize signals different in timing from one another, said initialize signal generator circuits being linked together so that upon receipt of an initialize signal as output from a certain stage, another stage next thereto is activated.

9. The device according to claim 8, wherein said plurality of stages of initialize signal generator circuits are linked via more than one signal line in such a manner that an initialize signal as output from a certain stage is transferred over a signal line and supplied to each said control data storage circuit while letting an initialize signal obtainable at a terminate end of said signal line be input to the next stage as an activation signal.

10. The device according to claim 8, further comprising:
a waveform reshaping circuit as inserted to at least one portion of said signal line.

11. The device according to claim 8, wherein each of said control data storage circuits is a defect address storage circuit for storing therein a defect address in a memory cell array and for controlling, when the defect address is accessed, replacement of a corresponding defective cell array with a redundancy cell array.

12. The device according to claim 11, wherein said defect address storage circuit includes fuse latch circuits each having a laser-meltable fuse element and a latch for reading data out of said fuse element and for storing the data therein, and wherein said plurality of stages of initialize signal generator circuits include a precharge signal generator circuit for generating a precharge signal for initialization of a latch node of each fuse latch circuit and a fuse set signal generator circuit activatable by said precharge signal as transferred to each said fuse latch circuit via a corresponding signal line for generating a fuse set signal used to read and store fuse data of each fuse latch circuit.

13. The device according to claim 11, wherein said defect address storage circuit includes fuse latch circuits each having an electrical capacitive fuse, a first latch for reading data of said electrical capacitive fuse via a transfer gate and for storing the data therein, a sense-use transistor operatively responsive to receipt of data of said first latch for performing a turn-on/off switching operation, and a second latch for reading and holding a state of said transistor therein, and wherein said plurality of stages of initialize signal generator circuits include a read signal generator circuit for generating a read signal used to drive said transfer gate, an activation signal generator circuit activatable by said read signal as output from said read signal generator circuit and sent to each said fuse latch circuit via a first signal line for generating an activation signal used to make said first latch active, a precharge signal generator circuit activatable by the activation signal as output from said activation signal generator circuit and sent to each said fuse latch circuit via a second signal line for generating a precharge signal for initialization of a latch node of said second latch, and a fuse set signal generator circuit activatable by said precharge signal as output from said precharge signal generator circuit and sent to each said fuse latch circuit via a third signal line for generating a fuse set signal used for transfer of data of said sense-use transistor toward said second latch and then storage of the data therein.

* * * * *